(12) United States Patent
Lee

(10) Patent No.: US 10,879,237 B2
(45) Date of Patent: Dec. 29, 2020

(54) SEMICONDUCTOR DEVICE AND METHOD OF MANUFACTURING THE SAME

(71) Applicant: SAMSUNG ELECTRONICS CO., LTD., Suwon-si (KR)

(72) Inventor: Hae-Wang Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/230,656

(22) Filed: Dec. 21, 2018

(65) Prior Publication Data

US 2019/0123046 A1 Apr. 25, 2019

Related U.S. Application Data

(63) Continuation of application No. 15/295,115, filed on Oct. 17, 2016, now Pat. No. 10,204,902.

(30) Foreign Application Priority Data

Feb. 26, 2016 (KR) .................. 10-2016-0022949

(51) Int. Cl.

| H01L 27/088 | (2006.01) |
| H01L 29/423 | (2006.01) |
| H01L 29/78 | (2006.01) |
| H01L 29/10 | (2006.01) |
| H01L 23/535 | (2006.01) |
| H01L 29/08 | (2006.01) |
| H01L 21/8234 | (2006.01) |
| H01L 29/66 | (2006.01) |

(Continued)

(52) U.S. Cl.
CPC .... *H01L 27/088* (2013.01); *H01L 21/823412* (2013.01); *H01L 21/823418* (2013.01);
(Continued)

(58) Field of Classification Search
None
See application file for complete search history.

(56) References Cited

U.S. PATENT DOCUMENTS

| 6,548,357 B2 | 4/2003 | Weybright et al. |
| 7,402,483 B2 | 7/2008 | Yun et al. |

(Continued)

FOREIGN PATENT DOCUMENTS

| KR | 10-0533511 | 11/2005 |
| KR | 10-0555567 | 2/2006 |

(Continued)

*Primary Examiner* — Moazzam Hossain
*Assistant Examiner* — Stanetta D Isaac
(74) *Attorney, Agent, or Firm* — F. Chau & Associates, LLC

(57) ABSTRACT

A semiconductor device includes a first active structure on a substrate including a first epitaxial pattern, a second epitaxial pattern and a first channel pattern between the first epitaxial pattern and the second epitaxial pattern, the first channel pattern including at least one channel pattern stacked on the substrate. A first gate structure is disposed on top and bottom surfaces of the first channel pattern. A second active structure on the substrate and includes the second epitaxial pattern, a third epitaxial pattern and a second channel pattern between the second epitaxial pattern and the third epitaxial pattern in the first direction. The second channel pattern includes at least one channel pattern stacked on the substrate. The number of stacked second channel patterns is greater than the number of stacked first channel patterns. A second gate structure is disposed on top and bottom surfaces of the second channel pattern.

11 Claims, 39 Drawing Sheets

(51) Int. Cl.
*H01L 29/51* (2006.01)
*H01L 29/786* (2006.01)

(52) U.S. Cl.
CPC .... *H01L 21/823437* (2013.01); *H01L 23/535* (2013.01); *H01L 29/0847* (2013.01); *H01L 29/1033* (2013.01); *H01L 29/42356* (2013.01); *H01L 29/42392* (2013.01); *H01L 29/517* (2013.01); *H01L 29/6656* (2013.01); *H01L 29/66772* (2013.01); *H01L 29/785* (2013.01); *H01L 29/7831* (2013.01); *H01L 29/78654* (2013.01); *H01L 29/78696* (2013.01)

(56) References Cited

U.S. PATENT DOCUMENTS

| | | |
|---|---|---|
| 7,425,744 B2 | 9/2008 | Mokhlesi et al. |
| 8,003,301 B2 | 8/2011 | Imai et al. |
| 8,017,483 B2 | 9/2011 | Freeman et al. |
| 8,313,993 B2 | 11/2012 | Cho et al. |
| 8,962,463 B2 | 2/2015 | Ji et al. |
| 9,093,318 B2 | 7/2015 | Polishchuk et al. |
| 9,184,269 B2 | 11/2015 | Ching et al. |
| 2013/0149852 A1 | 6/2013 | Nakamura et al. |
| 2014/0097502 A1 | 4/2014 | Sun et al. |
| 2015/0069328 A1 | 3/2015 | Leobandung |
| 2017/0250180 A1 | 8/2017 | Lee |

FOREIGN PATENT DOCUMENTS

| | | |
|---|---|---|
| KR | 1020080066568 | 7/2008 |
| KR | 1020090081346 | 7/2009 |
| KR | 10-0976451 | 8/2010 |
| KR | 1020140084914 | 7/2014 |
| KR | 1020140097443 | 8/2014 |
| KR | 1020150040806 | 4/2015 |
| KR | 10-1547707 | 8/2015 |

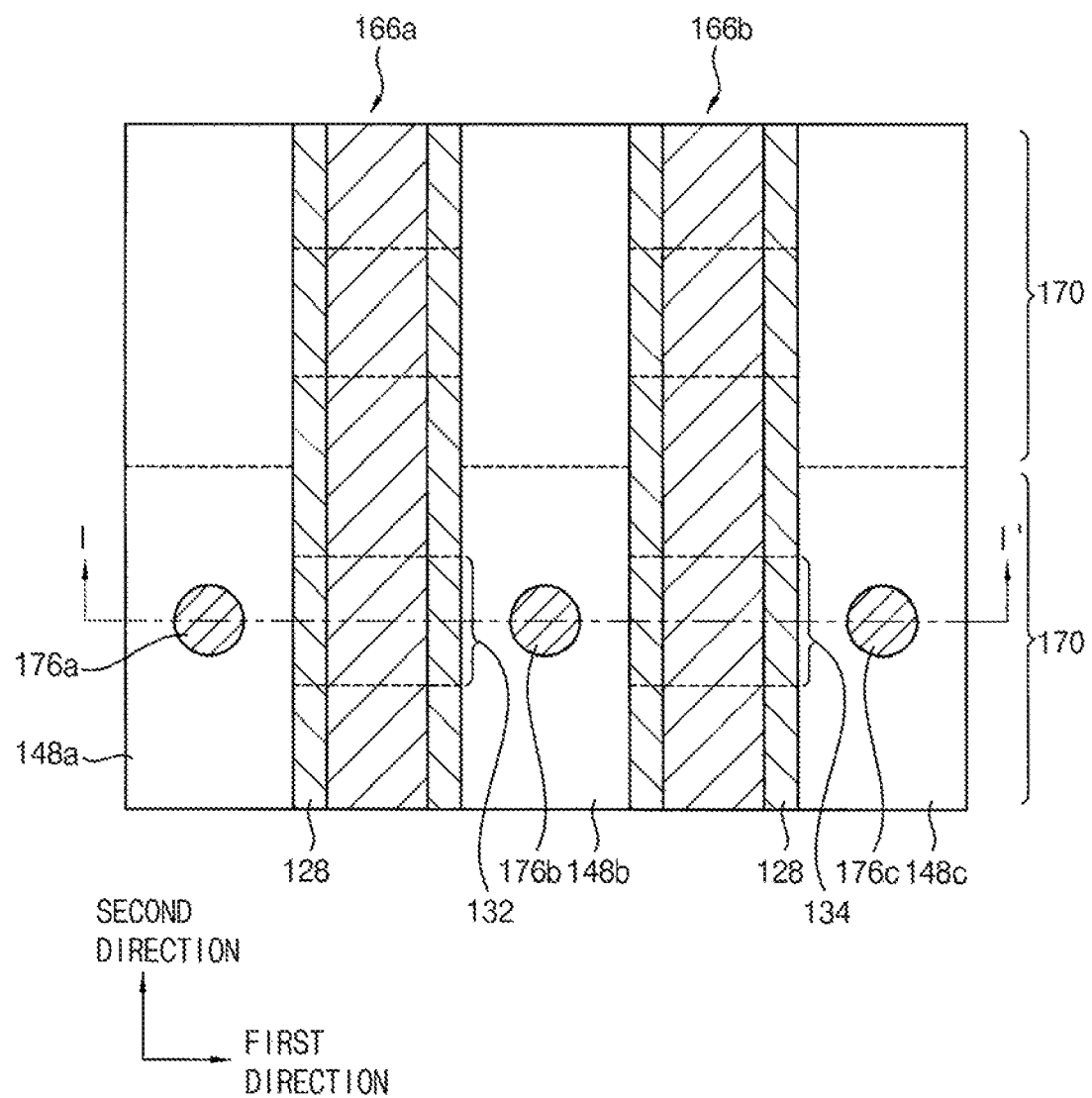

FIG. 2
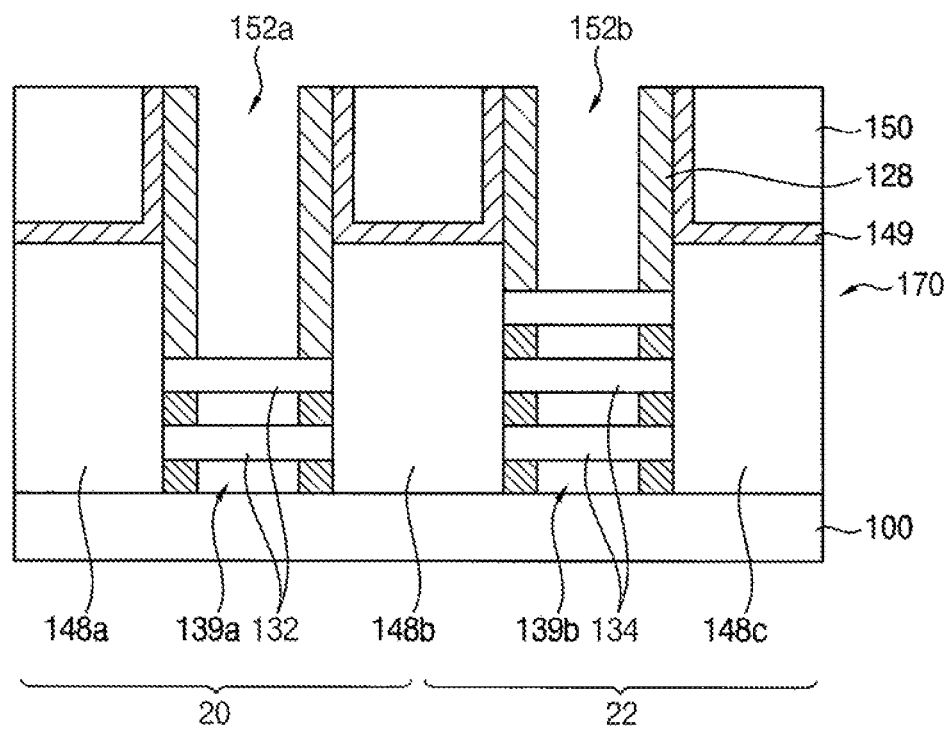
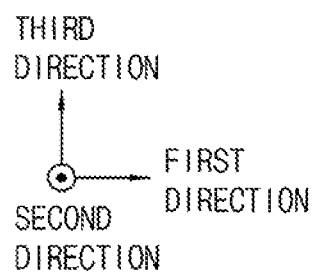

FIG. 9
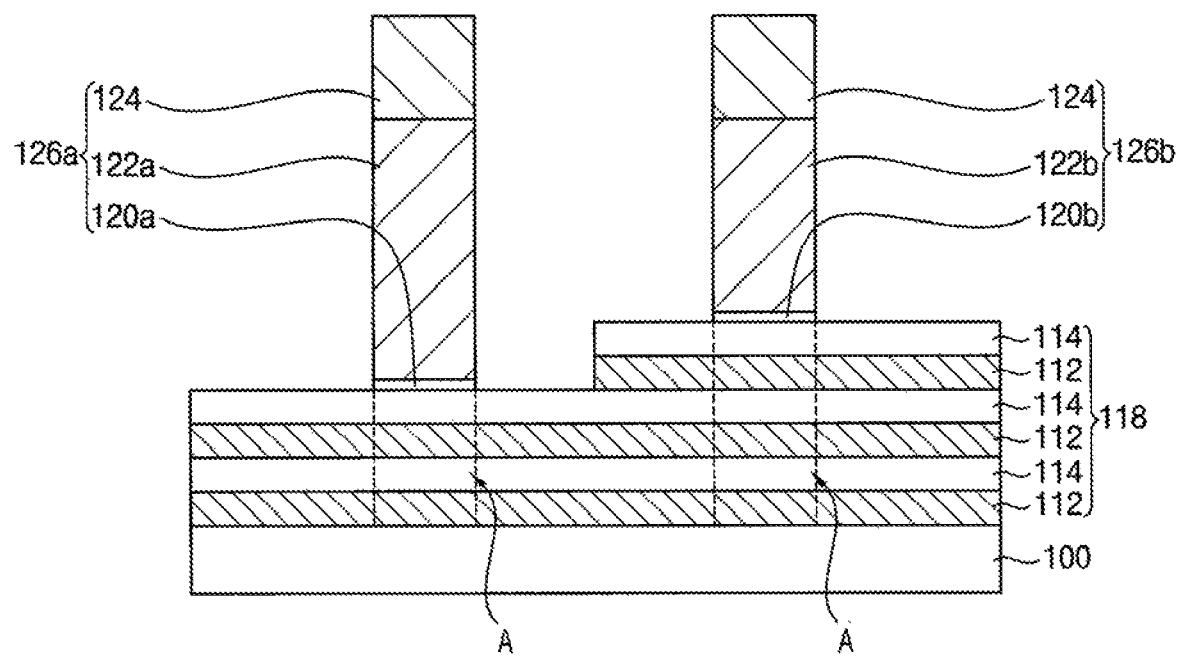
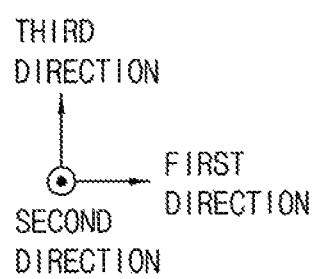

FIG. 11
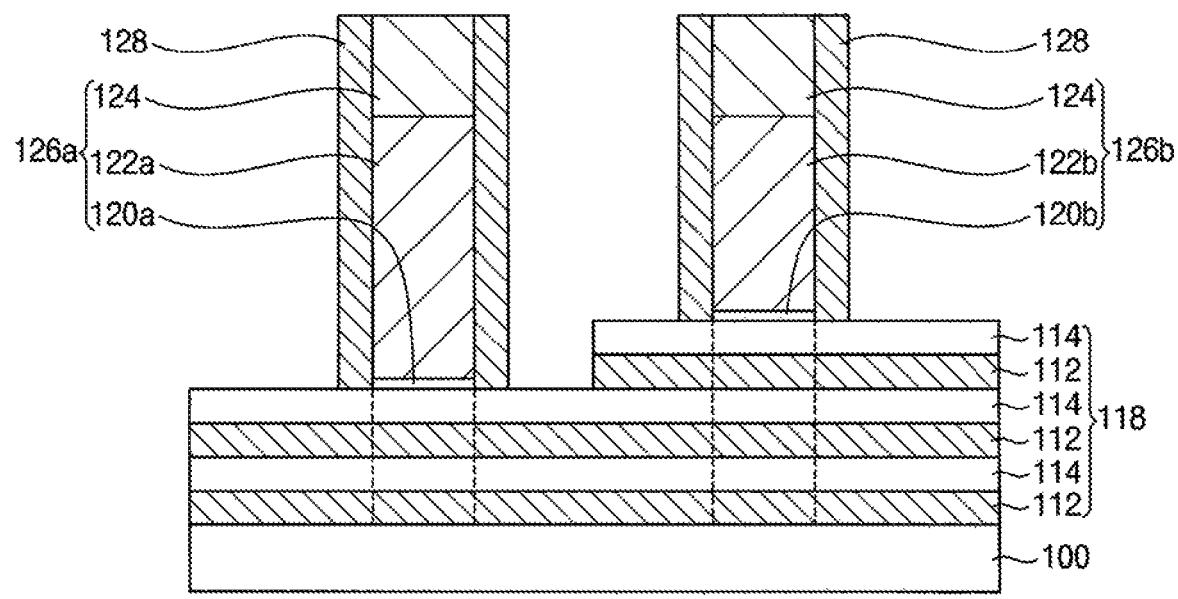
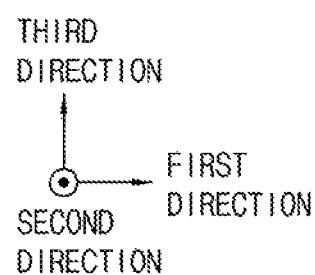

FIG. 13
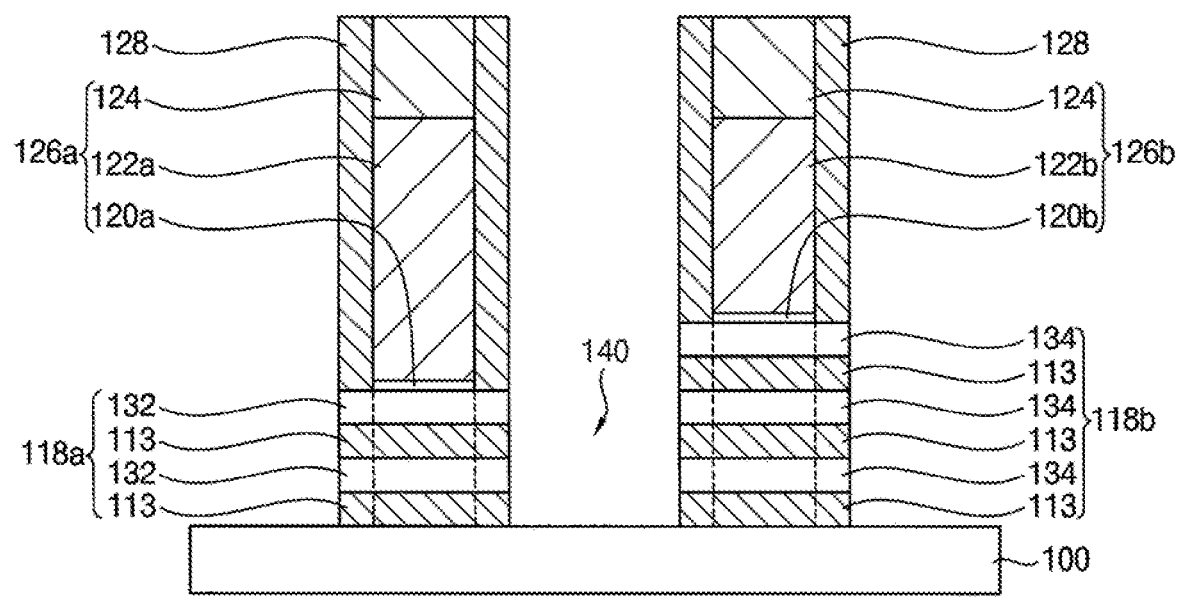
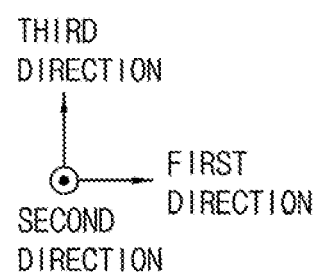

FIG. 15
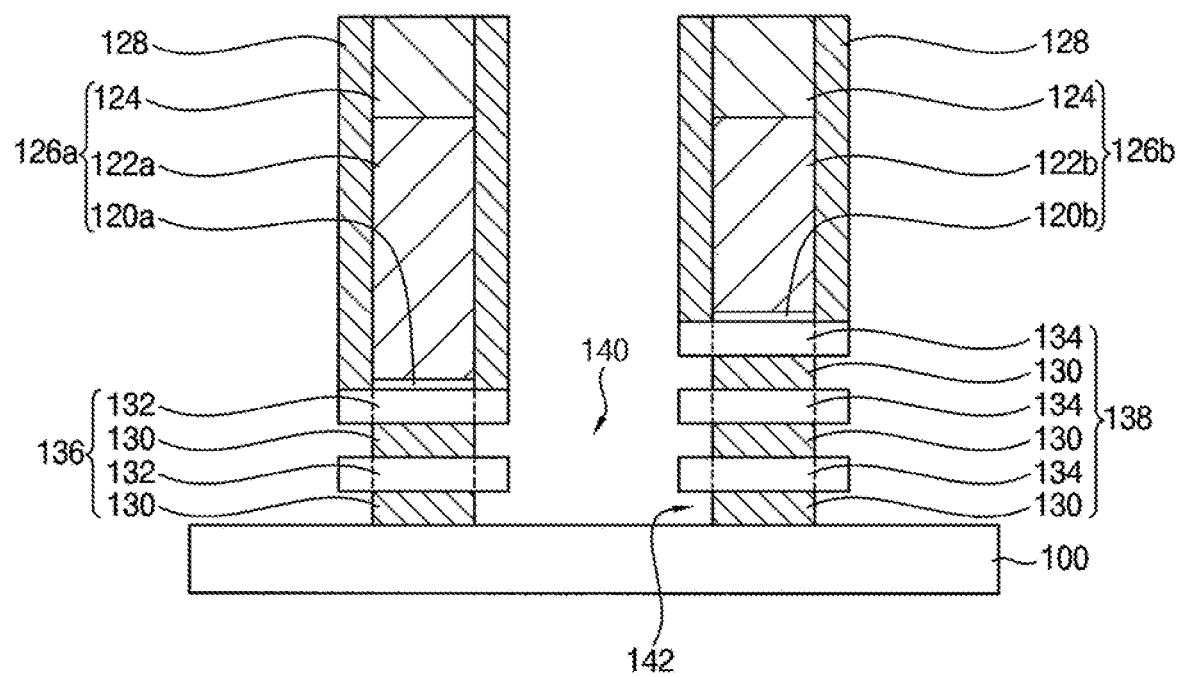
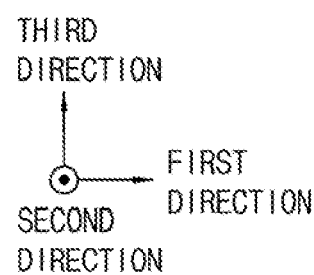

FIG. 17
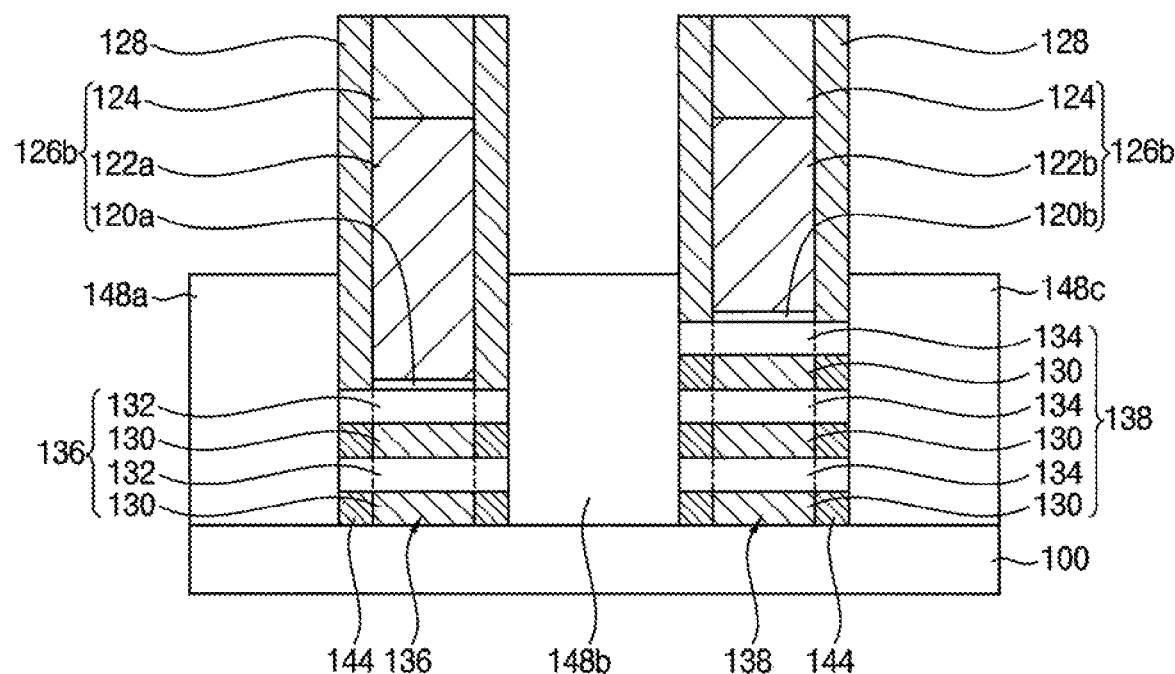
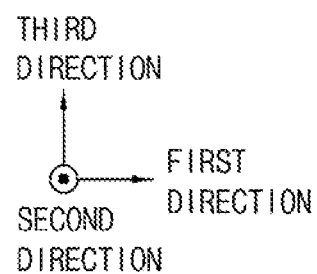

FIG. 19
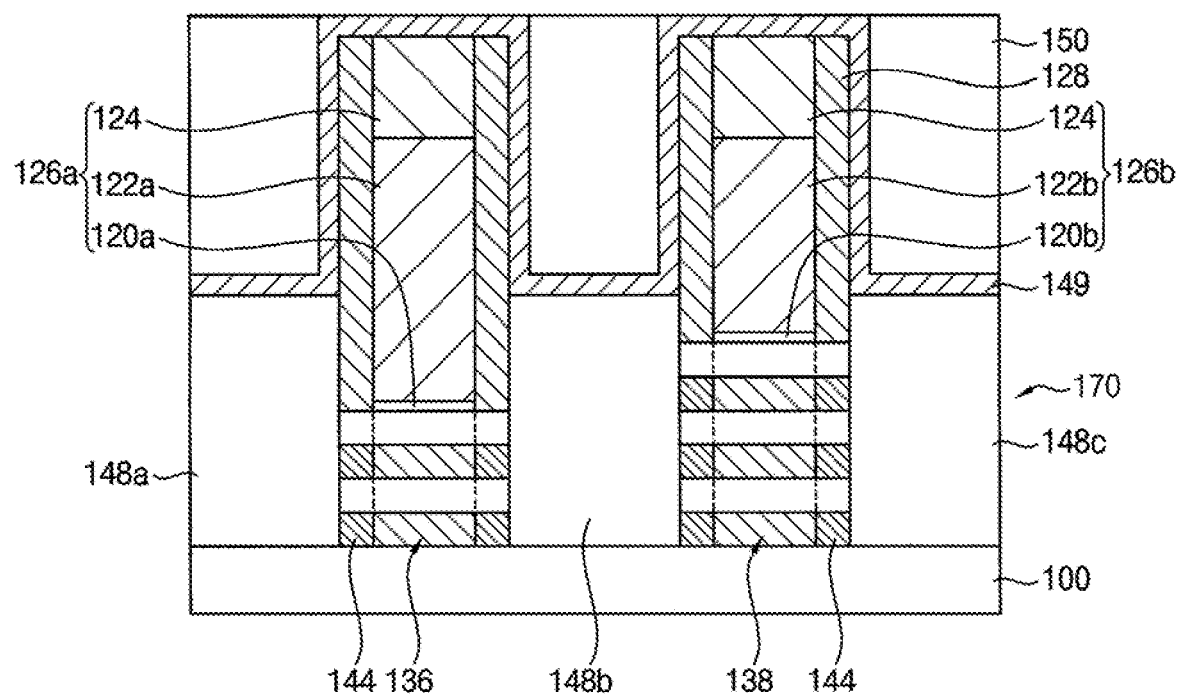
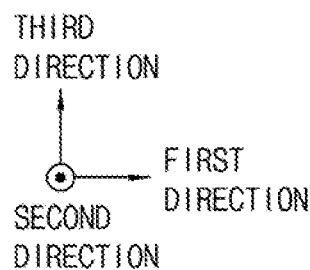

FIG. 20
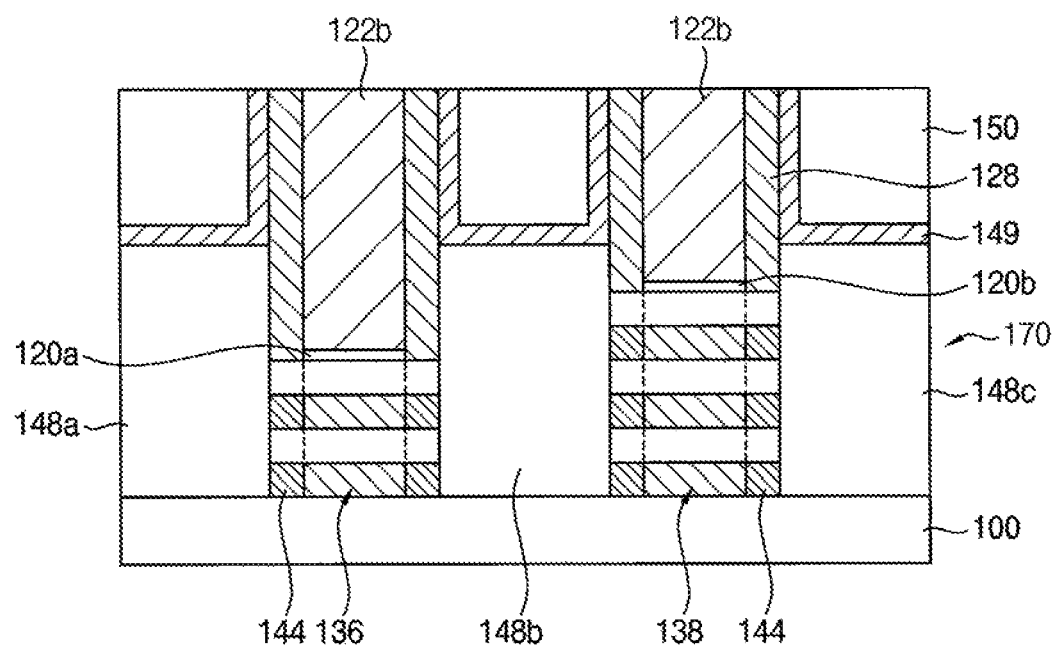
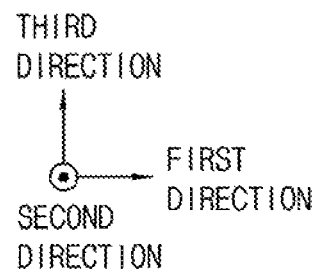

FIG. 23
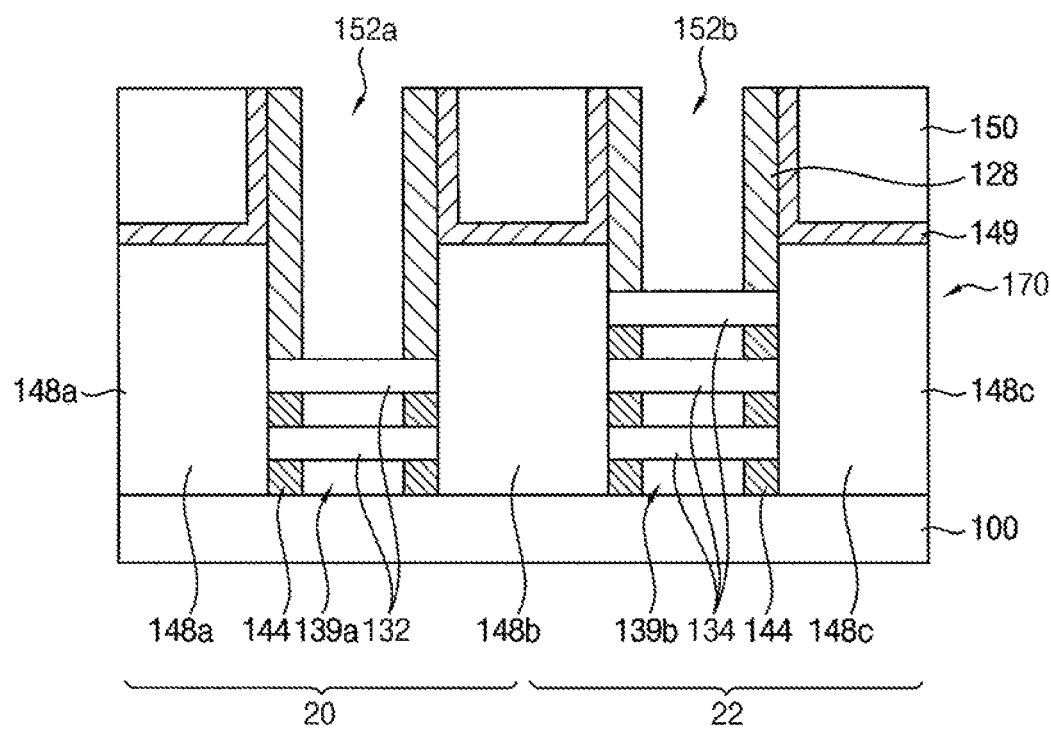
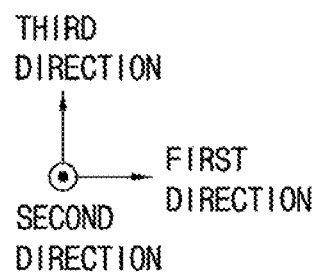

FIG. 35
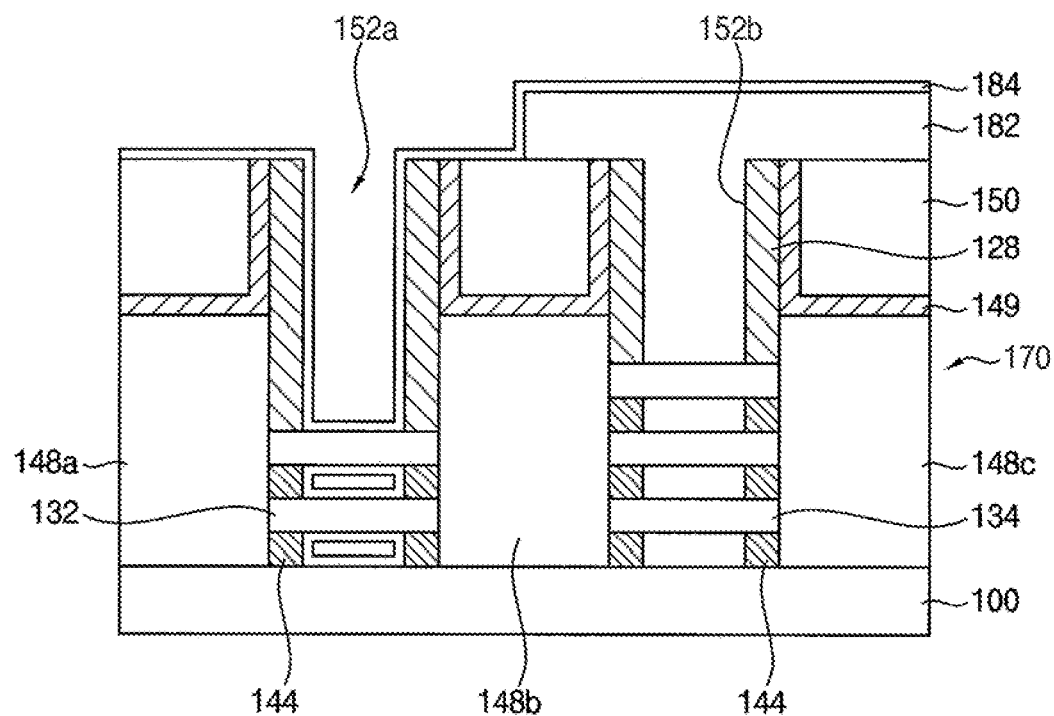
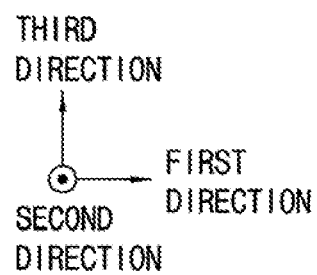

FIG. 36
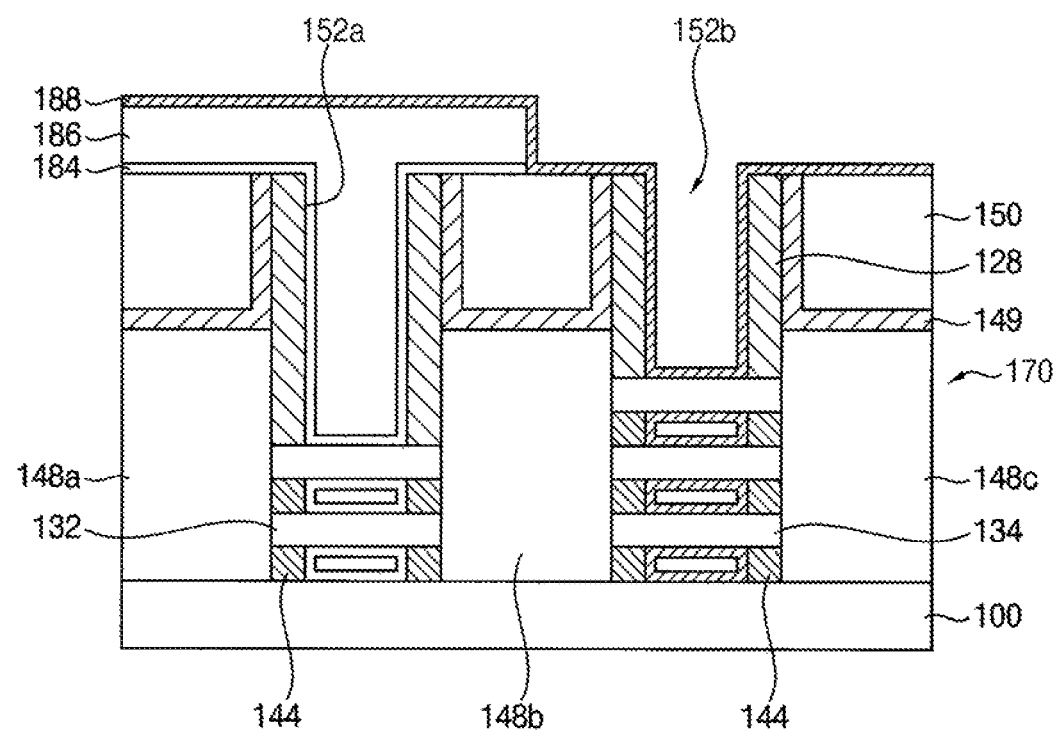
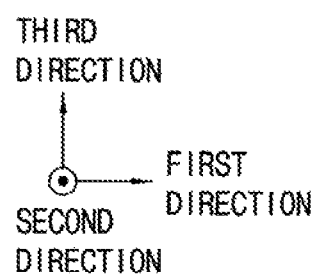

FIG. 37
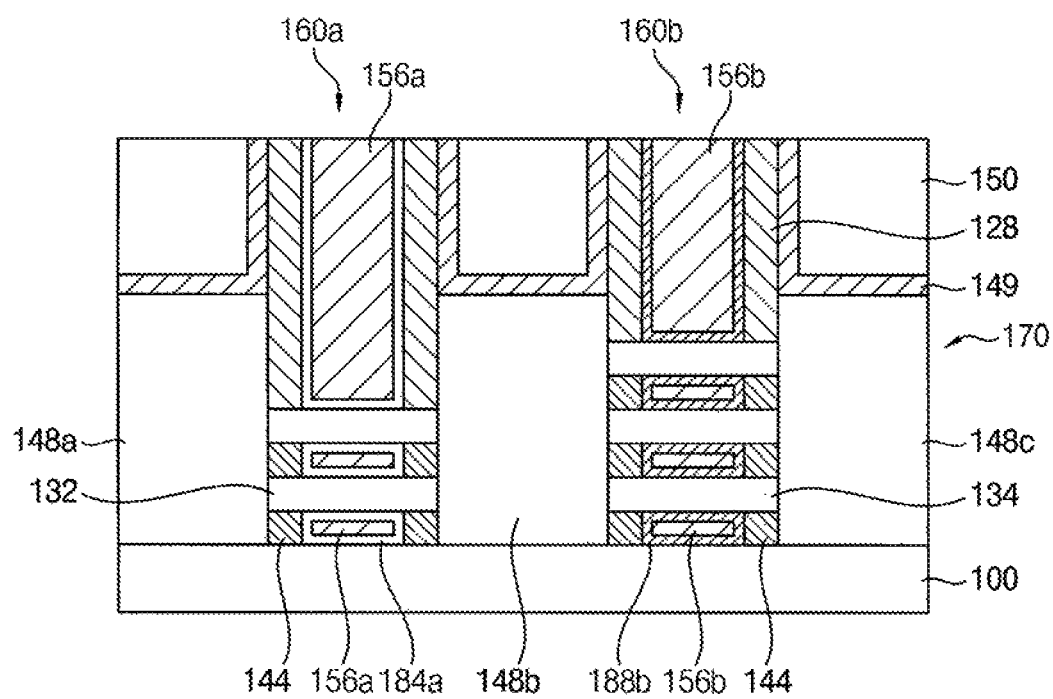
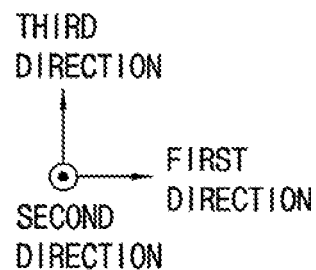

SEMICONDUCTOR DEVICE AND METHOD OF MANUFACTURING THE SAME

CROSS-REFERENCE TO RELATED APPLICATION

This application is a continuation of U.S. patent application Ser. No. 15/295,115, filed on Oct. 17, 2016, which claims priority under 35 U.S.C. § 119 to Korean Patent Application No. 10-2016-0022949 filed on Feb. 26, 2016 in the Korean Intellectual Property Office, the disclosures of both are incorporated by reference herein in their entirety.

1. TECHNICAL FIELD

Exemplary embodiments of the present inventive concept relate to a semiconductor device and a method of manufacturing the same.

2. DISCUSSION OF RELATED ART

Highly integrated semiconductor devices may include a high performance transistor. Highly integrated semiconductor devices may also include various types of transistors having different electrical characteristics.

SUMMARY

According to an exemplary embodiment of the present inventive concept, a semiconductor device includes a first active structure on a substrate and including a first epitaxial pattern, a second epitaxial pattern and a first channel pattern between the first epitaxial pattern and the second epitaxial pattern in a first direction parallel to a top surface of the substrate, the first channel pattern including at least two channel patterns stacked on the substrate. A first gate structure is disposed on top and bottom surfaces of the first channel pattern and extends in a second direction perpendicular to the first direction and parallel to the top surface of the substrate. A second active structure on the substrate and includes the second epitaxial pattern, a third epitaxial pattern and a second channel pattern between the second epitaxial pattern and the third epitaxial pattern in the first direction. The second channel pattern includes at least one channel pattern stacked on the substrate. The number of stacked second channel patterns is greater than the number of stacked first channel patterns. A second gate structure is disposed on top and bottom surfaces of the second channel pattern and extends in the second direction.

According to an exemplary embodiment of the present inventive concept, a semiconductor device includes a first active structure on a substrate and including a first epitaxial pattern, a second epitaxial pattern and a first channel pattern between the first epitaxial pattern and the second epitaxial pattern in a first direction parallel to a top surface of the substrate, the first channel pattern including at least one channel pattern stacked on the substrate. A first gate structure is disposed on top and bottom surfaces of the first channel pattern and extends in a second direction perpendicular to the first direction and parallel to the top surface of the substrate. A second active structure is on the substrate and includes a third epitaxial pattern, a fourth epitaxial pattern and a second channel pattern between the third epitaxial pattern and the fourth epitaxial pattern in the first direction. The second channel pattern includes at least one channel pattern stacked on the substrate. The number of stacked second channel patterns is greater than the number of stacked first channel patterns. A second gate structure is disposed on top and bottom surfaces of the second channel pattern and extends in the second direction. A dummy active structure is on the substrate. The dummy active structure includes the second epitaxial pattern, the third epitaxial pattern, a dummy channel pattern between the second epitaxial pattern and the third epitaxial pattern in the first direction. The dummy channel pattern includes at least one channel pattern stacked on the substrate. A dummy gate structure is disposed on top and bottom surfaces of the dummy channel pattern and extends in the second direction.

According to an exemplary embodiment of the present inventive concept, a semiconductor device includes a plurality of epitaxial patterns, on a substrate, that are spaced apart from each other in a first direction parallel to a top surface of the substrate. A plurality of channel pattern groups is between the plurality of epitaxial patterns in the first direction. Each of the plurality of channel pattern groups includes a plurality of channel patterns stacked in a second direction perpendicular to the top surface of the substrate. At least one channel pattern group of the plurality of channel pattern groups has a first number of channel patterns different from a second number of channel patterns included in another channel pattern group of the plurality of channel pattern groups. A plurality of gate structures is on the plurality of the channel pattern groups, respectively. Each of the plurality of gate structures extends in a third direction perpendicular to the first direction and parallel to the top surface of the substrate. Each of the plurality of gate structures is disposed on top and bottom surfaces of the plurality of channel patterns of each of the plurality of channel pattern groups.

According to an exemplary embodiment of the present inventive concept, a method of manufacturing a semiconductor device includes forming a first semiconductor structure in which first semiconductor patterns and first channel patterns are alternately and repeatedly stacked on a substrate. The first semiconductor structure has a first number of stacked first channel patterns. The method includes forming a second semiconductor structure in which second semiconductor patterns and second channel patterns are alternately and repeatedly stacked on the substrate. The second semiconductor structure has a second number of stacked second channel patterns different from the first number of stacked first channel patterns. The first semiconductor structure is spaced apart from the second semiconductor structure in a first direction parallel to a top surface of the substrate. A first epitaxial pattern is formed on a first sidewall of the first semiconductor structure. A second epitaxial pattern is formed on a second sidewall of the first semiconductor pattern and a first sidewall of the second semiconductor pattern. A third epitaxial pattern is formed on a second sidewall of the second semiconductor structure. The first and second semiconductor patterns of first and second semiconductor structures are selectively removed. A first gate structure is formed on top and bottom surfaces of the first channel patterns of the first semiconductor structure extending in a second direction perpendicular to the first direction and parallel to the top surface of the substrate. A second gate structure is formed on top and bottom surfaces of the second channel patterns of the second semiconductor structure extending in the second direction.

BRIEF DESCRIPTION OF THE DRAWINGS

FIGS. 1A and 1B are a cross-sectional view and a plan view illustrating a semiconductor device according to an exemplary embodiment of the present inventive concept;

FIG. 2 is a cross-sectional view illustrating an active structure in a semiconductor device according to an exemplary embodiment of the present inventive concept;

FIGS. 3 through 27 are perspective views, plan views and cross-sectional views illustrating a semiconductor device according to an exemplary embodiment of the present inventive concept;

FIGS. 35 through 37 are cross-sectional views illustrating a method of manufacturing a semiconductor device according to an exemplary embodiment of the present inventive concept.

DETAILED DESCRIPTION OF EXEMPLARY EMBODIMENTS

Various exemplary embodiments of the present inventive concept will be described more fully hereinafter with reference to the accompanying drawings, in which some exemplary embodiments are shown. The present inventive concept may, however, be embodied in many different forms and should not be construed as limited to the exemplary embodiments set forth herein.

Figure 1A:
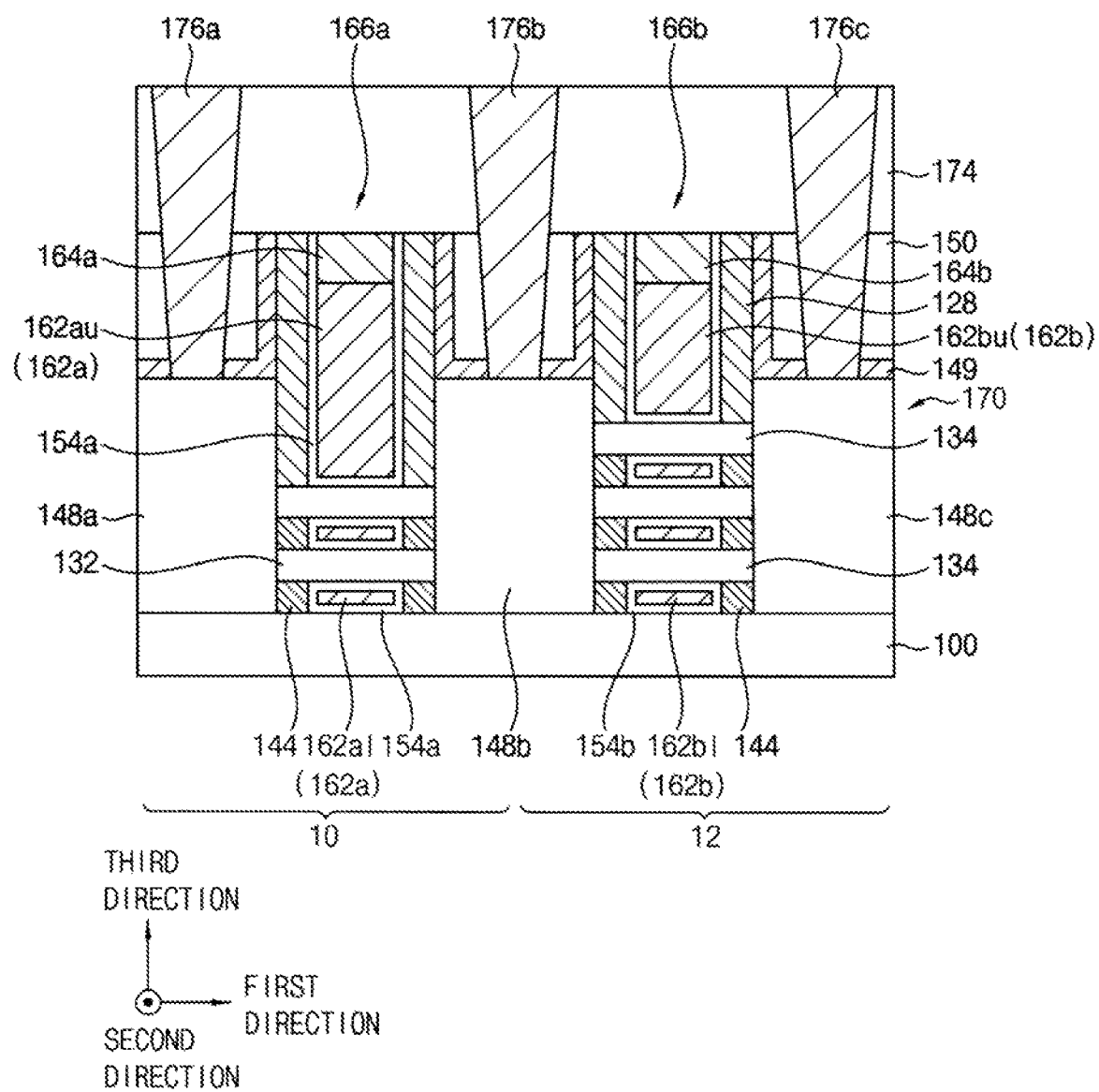

FIGS. 1A and 1B are a cross-sectional view and a plan view illustrating a semiconductor device according to an exemplary embodiment of the present inventive concept. FIG. 2 is a cross-sectional view illustrating an active structure in a semiconductor device according to an exemplary embodiment of the present inventive concept.

Referring to FIGS. 1A, 1B and 2, a first transistor 10 and a second transistor 12 that have different electrical characteristics from each other may be disposed on a substrate 100. The first transistor 10 and the second transistor 12 may be disposed adjacent to each other in a first direction parallel to a top surface of the substrate 100. In some exemplary embodiments, the first and second transistors 10 and 12 may share one impurity region. In some exemplary embodiments, the second transistor 12 may have a relatively higher operating current compared to the first transistor 10.

The substrate 100 may include a semiconductor material such as silicon, germanium or silicon-germanium, or a III-V group compound semiconductor.

A first active structure 20 included in the first transistor 10 and a second active structure 22 included in the second transistor 12 may be disposed on the substrate 100. A portion of the first and second active structures 20 and 22 may be shared. In other words, the first and second active structures 20 and 22 may be in contact with each other in the first direction and may form one active structure 170. The first active structure 20 may include a first epitaxial pattern 148a, a second epitaxial pattern 148b and a first channel pattern 132 between the first and second epitaxial patterns 148a and 148b. The first and second epitaxial patterns 148a and 148b may act as source/drain regions of the first transistor 10. The first and second epitaxial patterns 148a and 148b may be disposed on opposite sides of the first channel pattern 132 in the first direction. The first and second epitaxial pattern 148a and 148b may be in direct contact with the top surface of the substrate 100 on opposite sides of the first channel pattern 132.

The first channel pattern 132 may include a plurality of channel patterns between the first and second epitaxial patterns 148a and 148b. The plurality of first channel patterns 132 may be spaced apart from each other in a third direction perpendicular to the top surface of the substrate 100. The first channel patterns 132 may be spaced apart from the top surface of the substrate 100. Channels may be formed in respective ones of the first channel patterns 132. In some exemplary embodiments, the first channel pattern 132 may include one channel pattern between the first and second epitaxial patterns 148a and 148b.

The first channel patterns 132 may include two channel patterns; however, exemplary embodiments of the present inventive concept are not limited thereto. For example, the first channel patterns 132 may include three or more channel patterns.

In some exemplary embodiments, the first channel patterns 132 may each have substantially the same thickness in third direction. In other exemplary embodiments, at least one of the first channel patterns 132 may have a different thickness from the other first channel patterns 132 in the third direction.

Referring to FIG. 2, a plurality of first tunnels 139a may be formed between the first channel patterns 132. The first channel patterns 132 may be spaced apart from each other by the plurality of first tunnels 139a. The number of the first tunnels 139a may increase as the number of the first channel patterns 132 increases.

The first and second epitaxial patterns 148a and 148b may be doped with impurities to act as the source/drain regions. The first channel patterns 132 may be doped with impurities of an opposite conductive type to the first and second epitaxial patterns 148a and 148b.

A first gate structure 166a acting as a gate of the first transistor 10 may be positioned on the first active structure 20. The first gate structure 166a may surround the first channel patterns 132 and may extend in a second direction parallel to the top surface of the substrate and perpendicular to the first direction.

The first gate structure 166a may include a first gate insulating pattern 154a, a first gate electrode 162a and a first hard mask 164a that are stacked.

The first gate electrode 162a may include a first lower gate pattern 162al and a first upper gate pattern 162au. The first lower gate pattern 162al may be disposed in the plurality of first tunnels 139a, and the first upper gate pattern 162au may be disposed on a top surface of an uppermost one of the first channel patterns 132. The first lower and upper gate patterns 162al and 162au may be integrally connected to each other at regions between the first active structures 20 in the second direction.

The gate insulating pattern 154a may be disposed between the first gate electrode 162a and the first channel patterns 132. The first hard mask 164a may be disposed on the first upper gate pattern 162au.

The first gate insulating pattern 154a may be positioned on surfaces of the plurality of first tunnels 139a. The first gate insulating pattern 154a may be positioned on side and bottom surfaces of the first upper gate pattern 162au.

The first gate insulating pattern 154a may include a metal oxide having a high dielectric constant. For example, the first gate insulating pattern 154a may include hafnium oxide ($HfO_2$), tantalum oxide ($Ta_2O_5$) and/or zirconium oxide ($ZrO_2$).

The first gate 162a may include a first threshold voltage control pattern and a first metal pattern. The first threshold voltage control pattern may directly contact the first gate insulating pattern 154 and may have a work function depending on a desired threshold voltage of the first transistor 10. In some exemplary embodiments, the first threshold voltage control pattern may include titanium, titanium nitride and/or titanium aluminum nitride. The first metal pattern may include a metal, such as aluminum (Al), copper (Cu) or tantalum (Ta), and/or a metal nitride thereof.

The first hard mask 164 may include silicon nitride.

A first spacer 128 may be disposed on opposite sidewalls of the first upper gate pattern 166au. The first spacer 128 may be disposed on the top surface of the uppermost one of the first channel patterns 132. The first spacer 128 may be disposed on opposite sidewalls of the first gate structure 166a at the regions between the first active structures 20. The first spacer 128 may include, for example, silicon nitride.

A second spacer 144 may disposed between the first lower gate pattern 166al and the first epitaxial pattern 148a and between the first lower gate pattern 166al and the second epitaxial pattern 148b. The second spacer 144 may include an insulating material. For example, the second spacer 144 may include silicon oxide.

The second active structure 22 may include the second epitaxial pattern 148b, a third epitaxial pattern 148c and a second channel pattern 134 between the second epitaxial pattern 148b and the third epitaxial pattern 148c.

The second and third epitaxial patterns 148b and 148c may act as source/drain regions of the second transistor 12. The second and third epitaxial patterns 148b and 148c may be disposed on opposite sides of the second channel pattern 134 in the first direction. The second epitaxial pattern 148b may be commonly used by the first and second active structures 20 and 22.

The second and third epitaxial patterns 148b and 148c may be in direct contact with the substrate 100 and may contact opposite ends of the second channel pattern 134, respectively.

The second channel pattern 134 may include a plurality of channel patterns between the second epitaxial pattern 148b and the third epitaxial pattern 148c. The plurality of second channel patterns 134 may be spaced apart from each other in the third direction. In some exemplary embodiments, the second channel patterns 134 may be spaced apart from the top surface of the substrate 100.

The number of the second channel patterns 134 stacked in the third direction may be different from the number of the first channel patterns 132 stacked in the third direction. The number of stacked second channel patterns 134 may be greater than the number of stacked first channel patterns 132. Thus, an operating current of the second transistor 12 may be greater than the operating current of the first transistor 10.

In some exemplary embodiments, the second channel patterns 134 may each have substantially the same thickness in the third direction. Alternatively, at least one of the second channel patterns 134 may have a different thickness from the other second channel patterns 134 in the third direction.

In some exemplary embodiments, each of the second channel patterns 134 may be substantially parallel to each of the first channel patterns 132 at respective position levels. The first and second channel patterns 132 and 134 positioned at the same position level may have substantially the same thickness in the third direction.

In some exemplary embodiments, the second channel patterns 134 might not be arranged parallel to the first channel patterns 132 at respective position levels. In other exemplary embodiments, the second channel patterns 134 and the first channel patterns 132 may be arranged to be positioned at different position levels. At least one of the second channel patterns 134 may have a different thickness from the first channel patterns 132 in the third direction.

A plurality of second tunnels 139b may be formed between the second channel patterns 134. Thus, adjacent second channel patterns 134 may be spaced apart from each other by a respective one of the plurality of second tunnels 139b. In some exemplary embodiments, the number of the second tunnels 139b may be greater than the number of the first tunnels 139a.

The second and third epitaxial patterns 148a and 148c may be doped with impurities to act as the source/drain regions. The second channel patterns 134 may be doped with impurities of an opposite conductive type to the second and third channel patterns 148b and 148c.

A second gate structure 166b acting as a gate of the second transistor 12 may be positioned on the second active structure 22. The second gate structure 166b may surround the second channel patterns 134 and may extend in the second direction.

The second gate structure 166b may include a second gate insulating pattern 154b, a second gate electrode 162b and a second hard mask 164b that are stacked.

The second gate electrode 162b may include a second lower gate pattern 162bl and a second upper gate pattern 162bu. The second lower gate pattern 162bl may be disposed in the second tunnels 139b and may extend in the second direction. The second upper gate pattern 162bu may be disposed on a top surface of an uppermost one of the second channel patterns 134 and may extend in the second direction. The second lower and upper gate patterns 162bl and 162bu may be integrally connected to each other in regions between the second active structures 22 in the second direction.

In some exemplary embodiments, a top surface of the second upper gate pattern 162bu may be substantially coplanar with a top surface of the first upper gate pattern 162au. Thus, a thickness of the first upper gate pattern 162au in the third direction may be greater than that of the second upper gate pattern 162bu in the third direction.

A second gate insulating pattern 154b may be disposed between the second gate electrode 162b and the second channel patterns 134. A second hard mask 164b may be disposed on the second upper gate pattern 162bu.

The second gate insulating pattern 154b may be formed on a surface of the second lower gate pattern 162bl. The second gate insulating pattern 154b may be formed on side and bottom surfaces of the second upper gate pattern 162bu.

The second gate insulating pattern 154b may include a metal oxide material having a relatively high dielectric constant. For example, the second gate insulating pattern 154b may include hafnium oxide, tantalum oxide and/or zirconium oxide.

In some exemplary embodiments, the first and second gate insulating patterns 154a and 154b may include substantially the same material.

The second gate electrode 162b may include a second threshold voltage control pattern and a second metal pattern. The second threshold voltage control pattern may directly contact the second gate insulating pattern 154b and may have a work function depending on a desired threshold voltage of the second transistor 12. The second metal pattern may include a metal, such as aluminum (Al), copper (Cu) or tantalum (Ta), and/or metal nitride thereof. In some exemplary embodiments, the second gate electrode 162b may include substantially the same material as the first gate electrode 162a.

The first spacer 128 may be disposed on opposite sidewalls of the second upper gate pattern 162bu. The first spacer 128 may be disposed on the top surface of the uppermost one of the second channel patterns 134. The first spacer 128 may be disposed on opposite sidewalls of the second gate structure 166b at the regions between the second active structures 22.

The second spacer 144 may be disposed between the second lower gate pattern 162bl and the second epitaxial pattern 148b and between the second lower gate pattern 162bl and the third epitaxial pattern 148c.

In some exemplary embodiments, more than one active structures 170 may disposed on the substrate 100.

The active structures 170 may be positioned adjacent to each other in the second direction. The first epitaxial patterns 148a in the respective active structures 170 may be electrically connected to each other in the second direction. The second epitaxial patterns 148b in the respective active structures 170 may be connected to each other in the second direction. The third epitaxial patterns 148c in the respective active structures 170 may be connected to each other in the second direction. In some exemplary embodiments, the first through third epitaxial patterns 148a, 148b and 148c may extend in the second direction.

A first insulating interlayer 150 may be disposed on the first through third epitaxial patterns 148a, 148b and 148c and may fill a gap between the first and second gate structures 166a and 166b. The first insulating interlayer 150 may include, for example, silicon oxide.

In some exemplary embodiments, an insulating liner layer 149 may be conformally disposed on sidewalls of the first and second gate structures 166a and 166b and on top surfaces of the first through third epitaxial patterns 148a, 148b and 148c. The insulating liner 149 may include silicon nitride.

A second insulating interlayer 174 may be disposed on the first insulating interlayer 150. The second insulating interlayer 174 may include, for example, silicon oxide.

First through third contact plugs 176a, 176b and 176c may pass through the first and second insulating interlayers 150 and 174 and the insulating liner layer 149. The first contact plug 176a, the second contact plug 176b and the third contact plug 176c may contact the first epitaxial pattern 148a, the second epitaxial pattern 148b and the third epitaxial pattern 148c, respectively.

The first and second transistors 10 and 12 may include different numbers of channel patterns, and thus the electrical characteristics of the first and second transistors 10 and 12 may be different from each other. The first and second transistors 10 and 12 may be disposed adjacent each other and may share one impurity region.

The first and second transistors 10 and 12 adjacent each other may be formed on the same number of active structures 170 in the second direction. Thus, when the first and second transistors 10 and 12 are formed, a removing process of the active structure formed on some areas might not be needed. Thus, a variation in an effective area of the active structure by a removal of the active structure need not be generated, and thus electrical characteristics of the transistors need not be changed.

An additional pattern for device isolation need not be disposed between the first and second transistors 10 and 12. Thus, the first and second transistors 10 and 12 having the different electrical characteristics may be formed in a relatively narrow area.

FIGS. 3 through 27 are perspective views, plan views and cross-sectional views illustrating a semiconductor device according to an exemplary embodiment of the present inventive concept.

FIGS. 3 through 6 and 8 are perspective views, FIGS. 9, 11, 13, 15 through 17, 19 through 21, 23, 24, 26 and 27 are cross-sectional views, and FIGS. 7, 10, 12, 14, 18, 22 and 35 are plan views.

Figure 3:
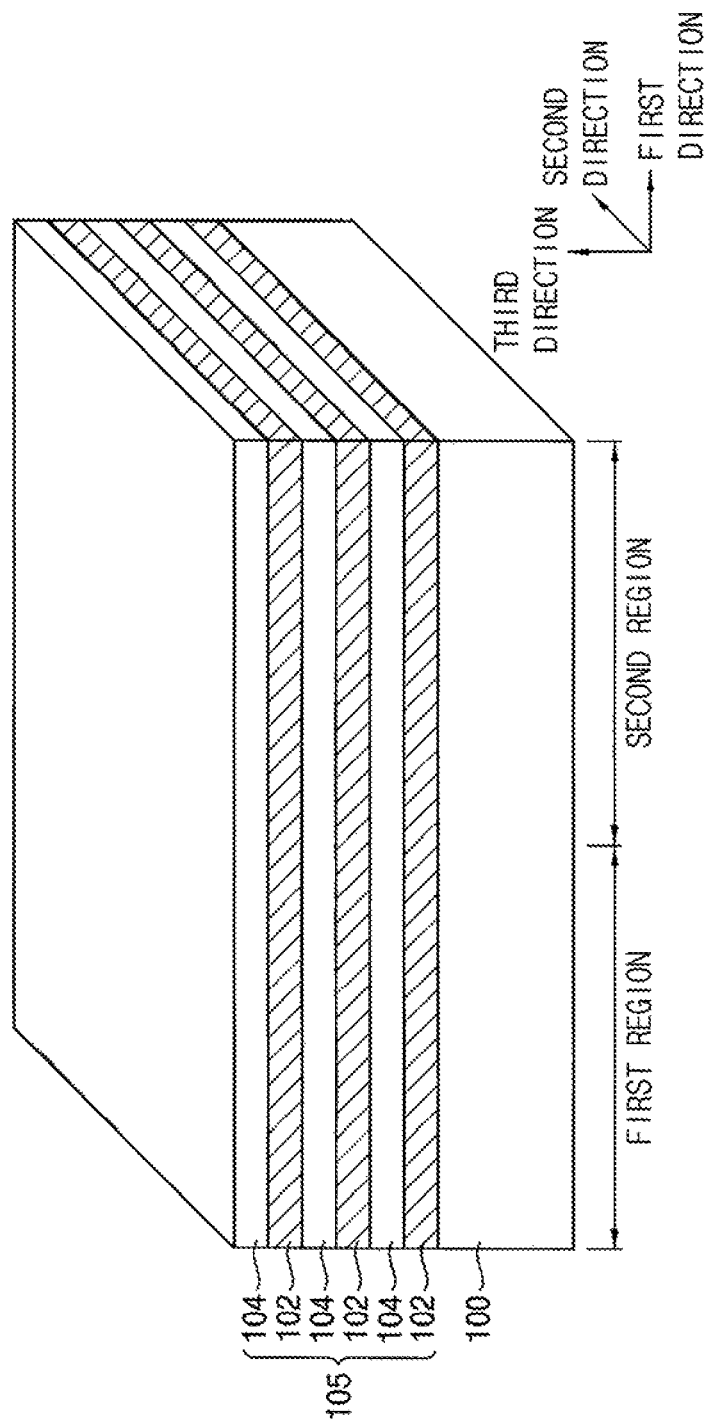

Referring to FIG. 3, a first semiconductor layer 102 and a second semiconductor layer 104 may be alternately and repeatedly stacked on a substrate 100 such that a first preliminary semiconductor structure 105 is formed.

The substrate 100 may include a semiconductor material such as silicon, germanium or silicon-germanium, or a III-V group compound semiconductor. In an exemplary embodiment, the substrate 100 may be a bulk silicon substrate.

The substrate 100 may include a first region in which a first transistor is formed and a second region in which a second transistor is formed.

The first semiconductor layer 102 may define regions in which the first and second gate patterns will be formed, and the second semiconductor layer 104 will be formed to be first and second channel patterns. Thus, the second semiconductor layer 104 may have substantially the same thickness as a desired thickness of the first and second channel patterns.

The first and second semiconductor layers 102 and 104 may each include a single crystal semiconductor material having an etching selectivity with respect to each other. In some exemplary embodiments, the first semiconductor layer 102 may include a single crystal silicon germanium, and the second semiconductor layer 104 may include a single crystal silicon. The first and second semiconductor layers 102 and 104 may be formed by an epitaxial growth process. In some exemplary embodiments, when the second semiconductor layer 104 is formed, impurities may be doped in-situ such that a channel doping process of the first and second transistors may be conducted.

The first semiconductor layers 102 may be formed to have substantially the same thickness. The second semiconductor layers 104 may be formed to have substantially the same thickness. In some exemplary embodiments, at least one of the second semiconductor layers 104 may be formed to have a different thickness from the other second semiconductor layers 104.

In some exemplary embodiments, an uppermost layer of the first preliminary semiconductor structure 105 may be a second semiconductor layer 104 of the semiconductor layers 104. In the first preliminary semiconductor structure 105, the number of stacked second semiconductor layers 104 may be the same as the number of second channel patterns (e.g., the second channel patterns 134) included in the second transistor (e.g., the second transistor 12).

Figure 4:
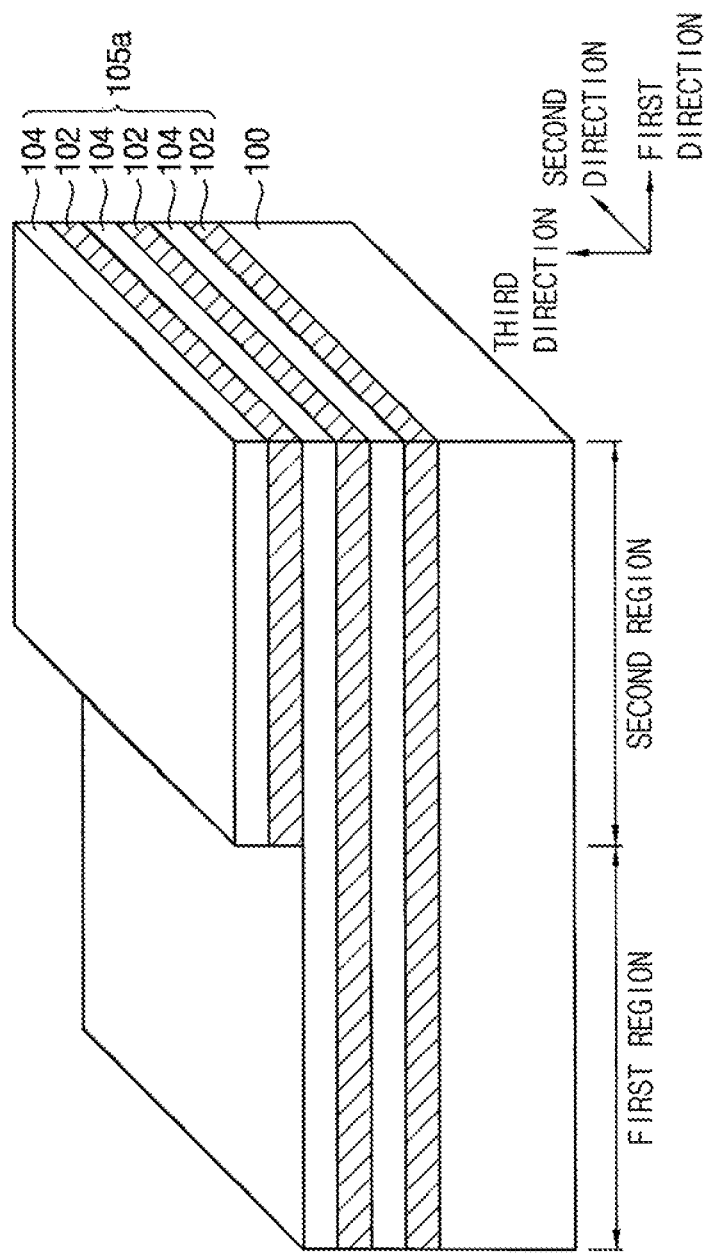

Referring to FIG. 4, a portion of the first and second semiconductor layers 102 and 104 in the first region may be etched. Thus, a second preliminary semiconductor structure 105a having a step in the first and second regions may be formed.

An etching mask that substantially covers a top surface of the first preliminary semiconductor structure 105 in the second region may be formed. The first and second layers 102 and 104 of the first preliminary semiconductor structure 105 in the first region may be partially sequentially etched using the etching mask such that the second preliminary structure 105a is formed.

In the second preliminary structure 105a, the number of stacked second semiconductor layers 104 in the first region may be the same as the number of first channel patterns (e.g., the first channel patterns 132) included the first transistor (e.g., the first transistor 10). An uppermost layer of the second preliminary semiconductor structure 105a in the first region may be a second semiconductor layer 104 of the second semiconductor layers 104 in the first region.

The etching mask may be removed.

Figure 5:
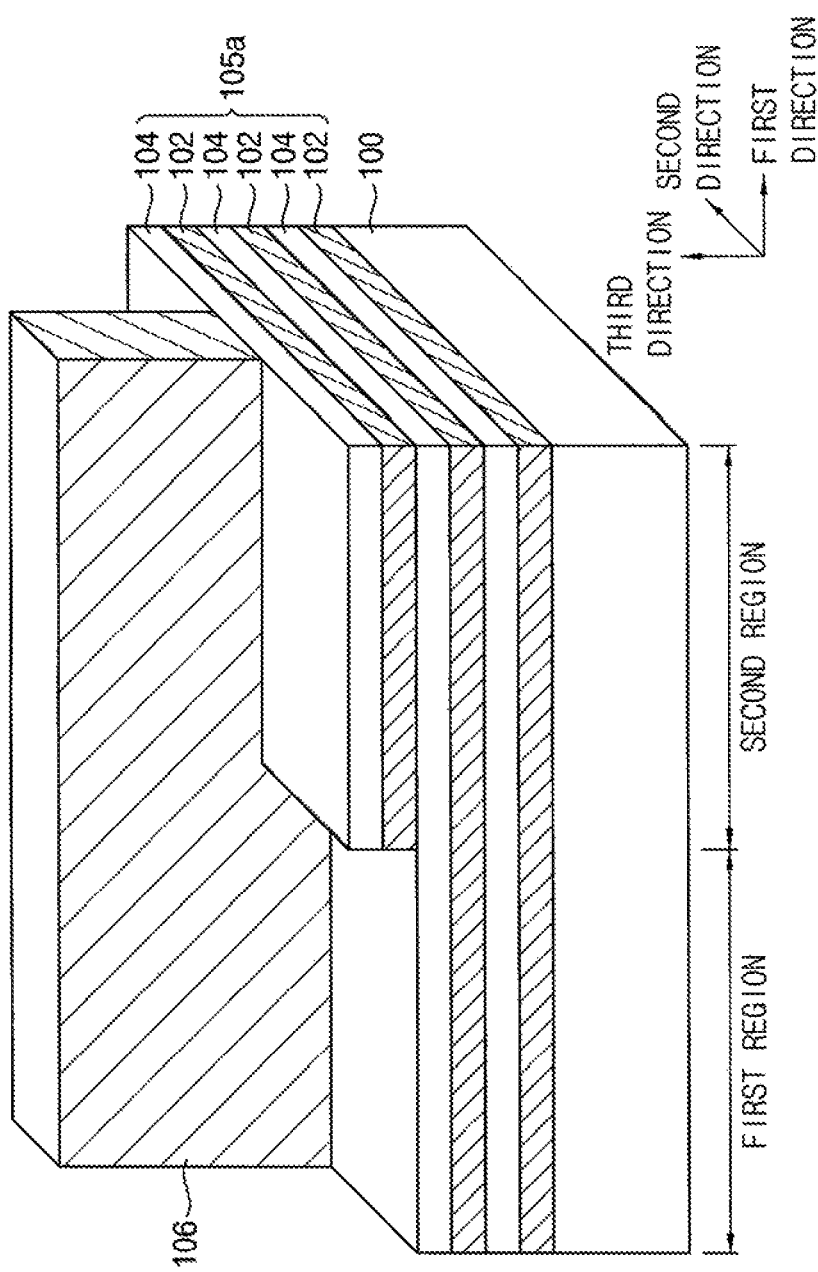

Referring to FIG. 5, a hard mask 106 may be formed on the second preliminary semiconductor structure 105a and may be patterned by a photolithography and etch process to form the hard mask 106. The hard mask 106 may have a linear shape that extends in the first direction. In some exemplary embodiments, a plurality of hard masks 106 may be formed and may be arranged in the second direction.

The hard mask 106 may include silicon nitride.

Figure 6:
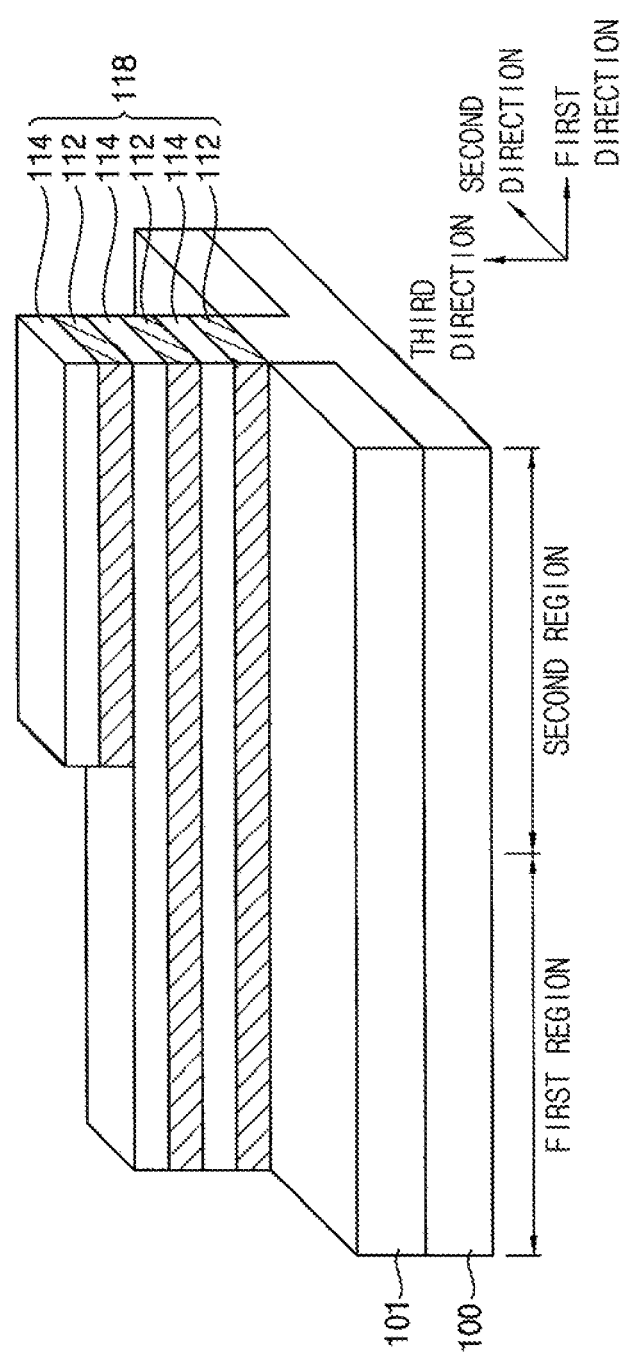
Figure 7:
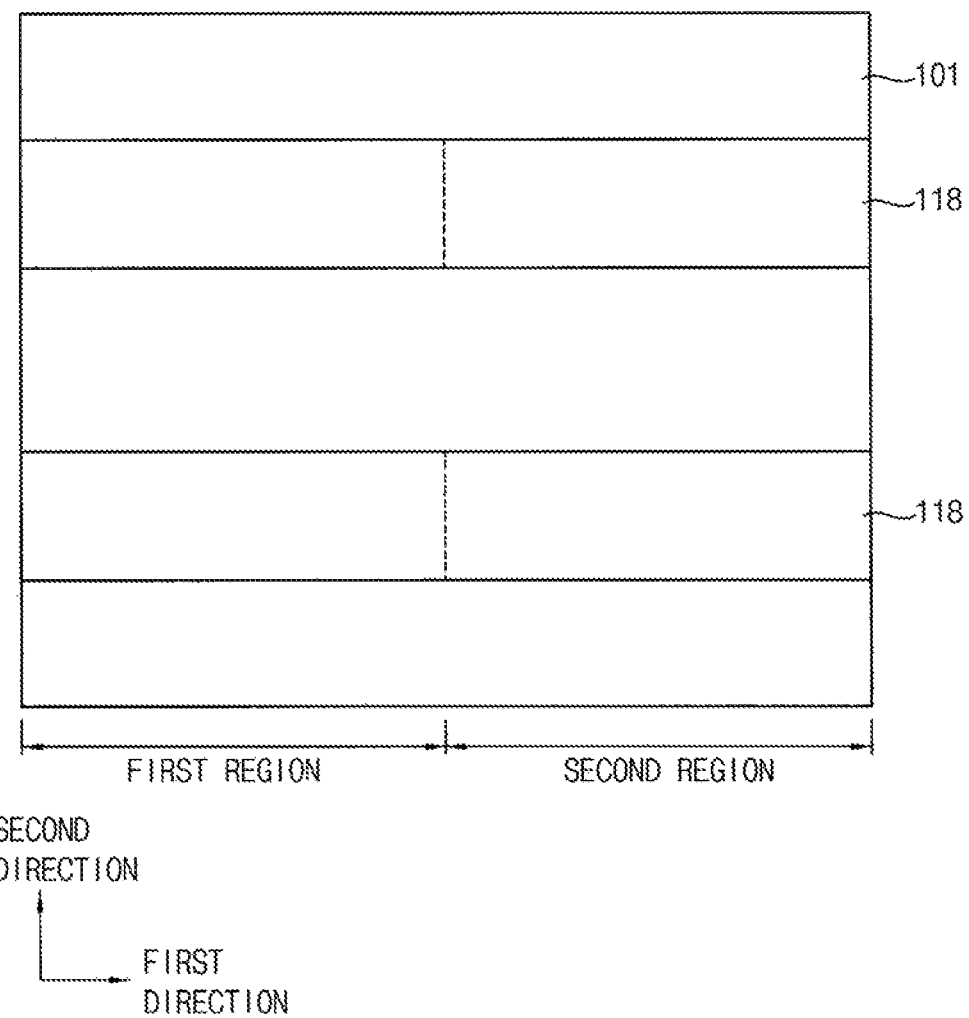

Referring to FIGS. 6 and 7, the second preliminary semiconductor structure 105a may be sequentially etched using the hard mask 106 as an etch mask, and then an upper portion of the substrate 100 may be etched. Thus, a first semiconductor structure 118 may be formed on the substrate 100 and may include a first semiconductor layer 112 and a second semiconductor layer 114 alternately and repeatedly stacked. A device isolation trench may be formed in the substrate 100. The first semiconductor structure 118 may extend in the first direction.

A device isolation layer may be formed on the substrate 100, and then an upper portion of the device isolation layer may be removed. Thus, a device isolation pattern 101 may be formed in the device isolation trench. The first semiconductor structure 118 may be disposed between the first device isolation patterns 101 and may protrude above the device isolation pattern 101. The device isolation pattern 101 may include, for example, silicon oxide.

Referring to FIG. 6, the first semiconductor structure 118 may be formed in one semiconductor structure. Alternatively, referring to FIG. 7, a plurality of first semiconductor structures 118 may be formed and each of the plurality of first semiconductor structures 118 may extend in the second direction.

A portion of the first semiconductor structure 118 in the first region may be referred to as a first portion of the first semiconductor structure 118, and another portion of the first semiconductor structure 118 in the second region may be referred to as a second portion of the first semiconductor structure 118.

Figure 8:
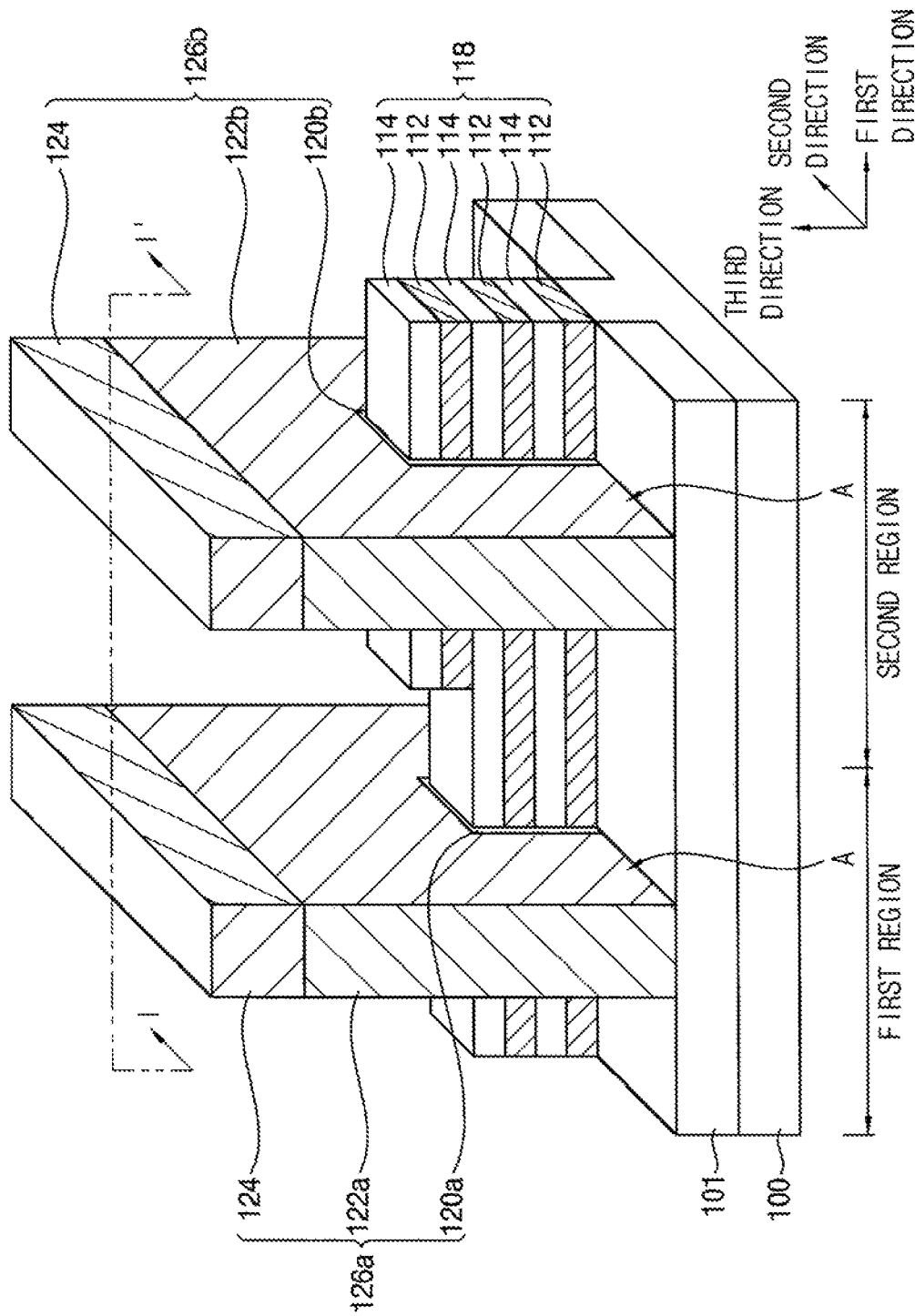
Figure 10:
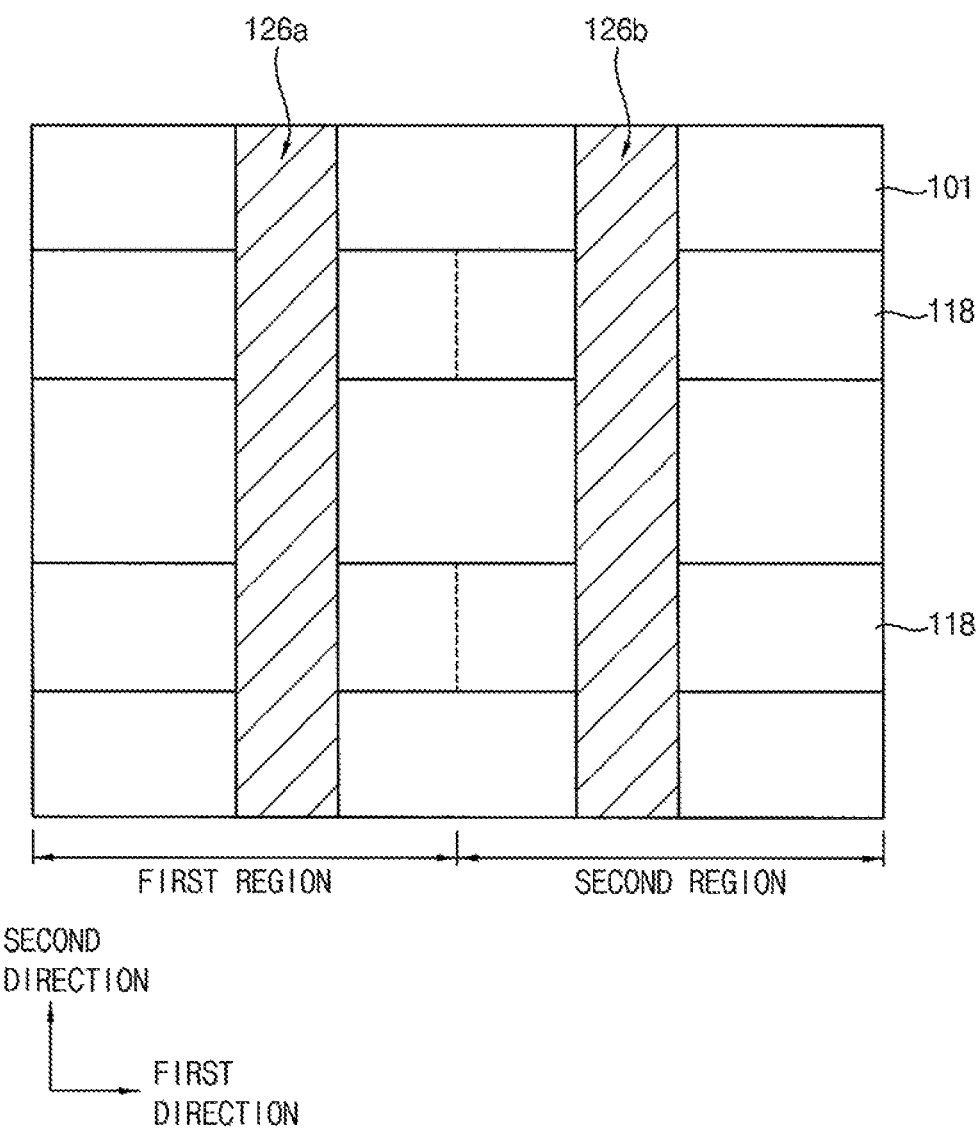

Referring to FIGS. 8 through 10, first and second mold gate structures 126a and 126b that extend in the second direction may be formed on the first semiconductor structure 118 and the device isolation pattern 101.

A mold gate insulating layer and a mold gate layer may be formed on the first semiconductor structure 118 and the device isolation pattern 101.

The mold gate insulating layer may include, for example, silicon oxide. The mold gate insulating layer may be formed by, for example, a chemical vapor deposition (CVD) process, an atomic layer deposition (ALD) process or a thermal oxidation process. The mold gate layer may include, for example, poly-silicon. The mold gate layer may be formed by, for example, an ALD process or a CVD process. After the mold gate layer is formed, a planarization process may be performed such that a top surface of the mold gate layer is planarized.

A hard mask layer may be formed on the mold gate layer and may be patterned by a photolithography and etching process, thereby forming a hard mask 124. The hard mask 124 may extend in the second direction. The hard mask 124 may cover a region in which the first and second gate structures of the first and second transistors are formed by a following process. Thus, the hard mask 124 may include at least one hard mask disposed on each of the first and second portions of the first semiconductor structure 118.

The mold gate layer and the mold gate insulating layer may be sequentially anisotropically etched using the hard mask 124 as an etch mask. Thus, the first mold gate structure 126a that includes a first mold gate insulating pattern 120a, a first mold gate pattern 122a and the hard mask 124 may be formed in the first region of the substrate 100. The second mold gate structure 126b that includes a second mold gate insulating pattern 120b, a second mold gate pattern 122b and the hard mask 124 may be formed in the second region of the substrate 100. The first and second mold gate structures 126a and 126b may define respective regions in which first and second gate structures of the first and second transistors will be formed.

The first mold gate structure 126a may be in direct contact with the device isolation pattern 101 and a sidewall and a top surface of the first portion of the first semiconductor structure 118 and may extend in the second direction. The second mold gate structure 126b may be in direct contact with the device isolation pattern 101 and a sidewall and a top surface of the second portion of the first semiconductor structure 118 and may extend in the second direction.

The top surfaces of the first and second mold gate patterns 122a and 122b may be substantially coplanar. Thus, a height of the second mold gate pattern 122b from the top surface of the first semiconductor structure 118 may be greater than that of the first mold gate pattern 122a from the top surface of the first semiconductor structure 118.

Regions illustrated as dashed lines in FIG. 9 may represent "A" portions of the first and second mold gate patterns illustrated in FIG. 8

Figure 12:
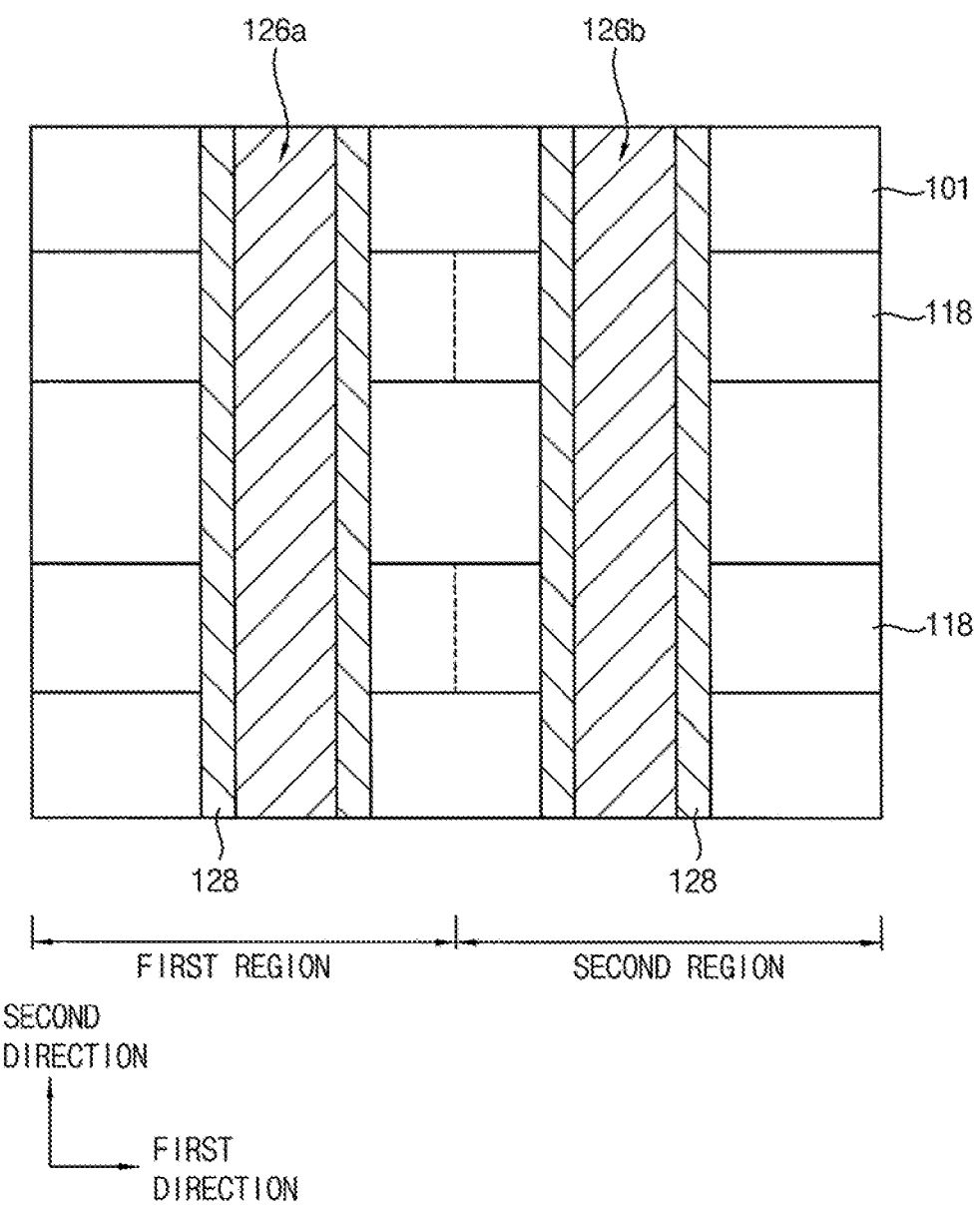

Referring to FIGS. 11 and 12, a first spacer 128 may be formed on sidewalls of the first and second mold gate structures 126a and 126b.

A first spacer layer may be conformally formed on the first and second mold gate structures 126a and 126b, the device isolation pattern 101 and the first semiconductor structure 118. The first spacer layer may include an insulating material, for example, silicon nitride.

The first spacer layer may be formed by, for example, a CVD process or an ALD process. The first spacer layer may be anisotropically etched such that the first spacer 128 is formed on the sidewalls of the first and second mold gate structures 126a and 126b.

Figure 14:
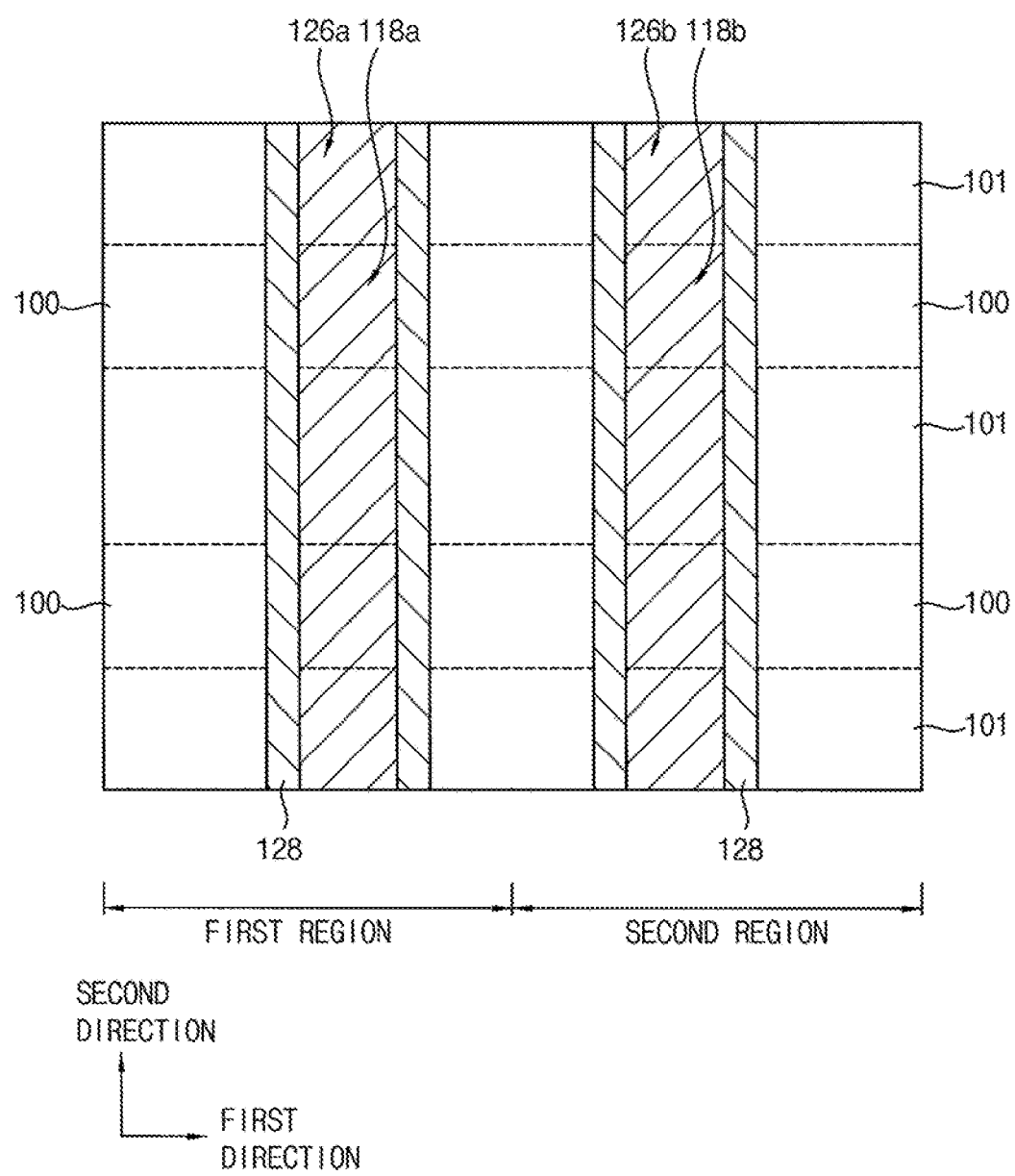

Referring to FIGS. 13 and 14, the first semiconductor structure 118 exposed between the first spacers 128 may be etched to form a second semiconductor structure 118a in the first region and a third semiconductor structure 118b in the second region. An opening 140 exposing the substrate 100 may be formed between the second and third semiconductor structures 118a and 118b.

The second semiconductor structure 118a may include a structure in which the first preliminary semiconductor patterns 113 and first channel patterns 132 are alternately stacked, and the third semiconductor structure 118b may include a structure in which the first preliminary semiconductor patterns 113 and second channel patterns 134 are alternately stacked. The number of stacked second channel patterns 134 may be greater than the number of stacked first channel patterns 132.

In the second and third semiconductor structures 118a and 118b, opposite sidewalls of the first preliminary semiconductor patterns 113 and the first and second channel patterns 132 and 134 may be exposed.

Referring to FIG. 15, the opposite sidewalls of the first preliminary semiconductor patterns 113 exposed in the second and third semiconductor structures 118a and 118b may be selectively etched to a predetermined depth in the first direction such that recesses 142 are formed. By the etching process, the second and third semiconductor structure 118a and 118b may respectively form first and second active structures 136 and 138.

The etching process may include an isotropic etching process, for example, a wet etching process or an isotropic dry etching process.

The first preliminary semiconductor patterns 113 may form first semiconductor patterns 130 of which a width in the first direction is decreased, through the etching process. In the etching process, the first and second channel patterns 132 and 134 need not be etched, and thus the first and second channel patterns 132 and 134 may further protrude in the first direction with respect to the first semiconductor patterns 130.

Figure 16:
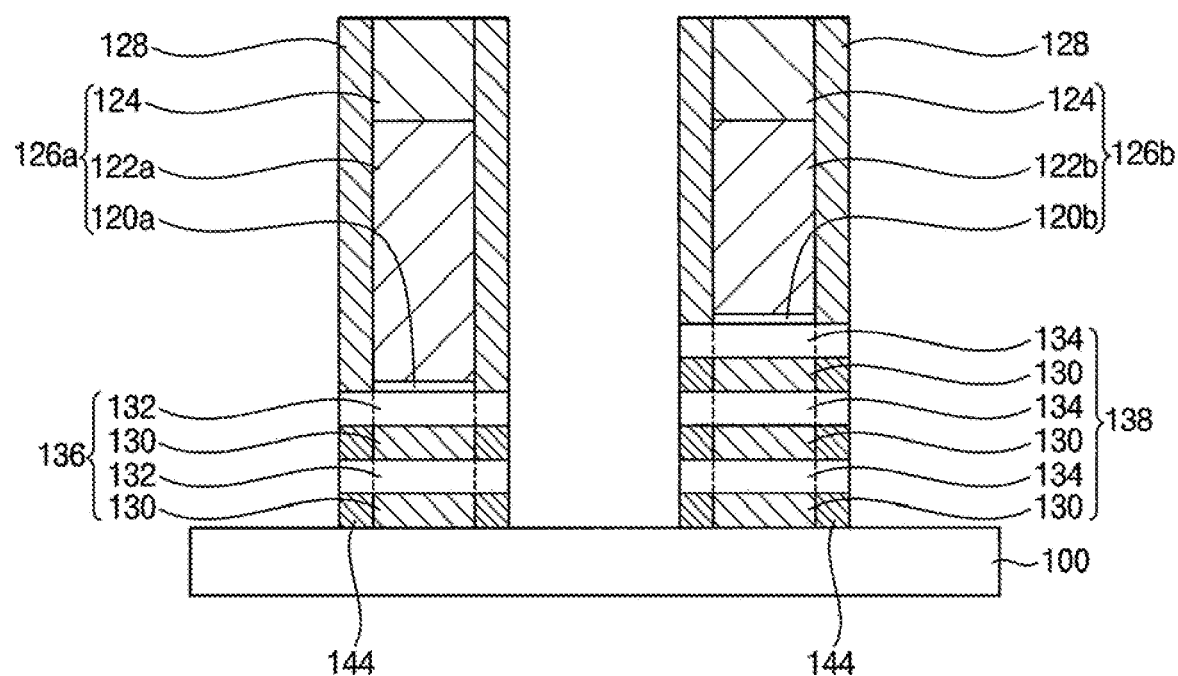

Referring to FIG. 16, a second spacer 144 may be formed on sidewalls of the first semiconductor patterns 130 and may fill the recesses 142. The second spacer 144 may include an insulating material, for example, silicon oxide.

A second spacer layer may be conformally formed on the first and second mold gate structures 126a and 126b, the substrate 100, the device isolation pattern 101 and the first and second channel patterns 132 and 134. The second spacer layer may be formed to fill the recesses 142 formed on the sidewalls of the first semiconductor patterns 130. The second spacer layer may be formed by, for example, a CVD process or an ALD process. Since the second spacer layer may be formed along surfaces of the first and second mold gate structures 126a and 126b, the substrate 100, the device isolation pattern 101 and the first and second channel patterns 132 and 134, in the deposition process, a portion of the second spacer layer formed in the recesses 142 may be formed thicker than other portions of the second spacer layer.

The second spacer layer formed on the first and second mold gate structures 126a and 126b, the substrate 100, the device isolation pattern 101 and the first and second channel patterns 132 and 134 may be removed such that the second spacer 144 filling the recesses 142 is formed on the sidewalls of the first semiconductor patterns 130. In some exemplary embodiments, the second spacer layer may be removed by a wet etching process or a wet cleaning process.

Figure 18:
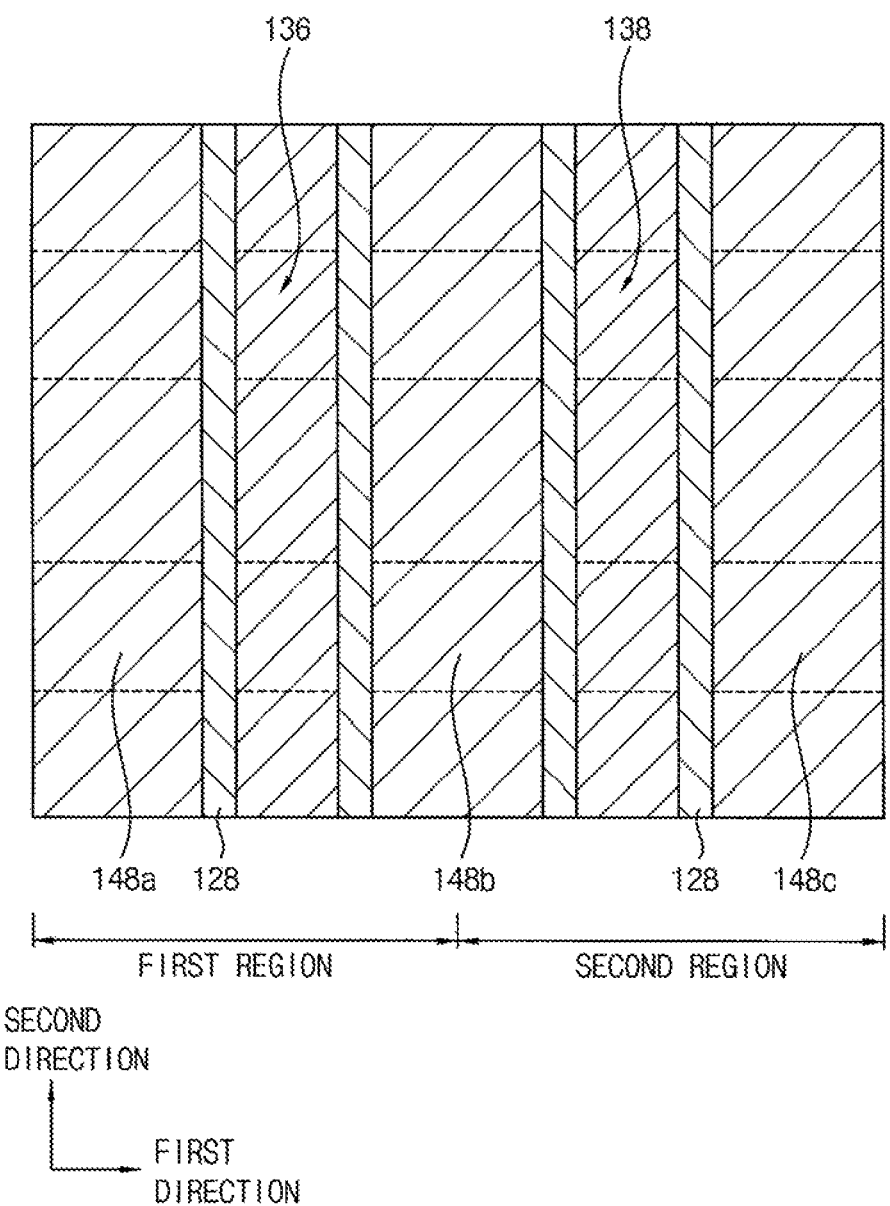

Referring to FIGS. 17 and 18, first, second and third epitaxial patterns 148a, 148b and 148c may be formed on the substrate 100 exposed at opposite sides of the first and second mold gate structures 126a and 126b. The first and second epitaxial patterns 148a and 148b may be formed at the opposite sides of the first mold gate structure 126a, respectively. The second and third epitaxial patterns 148b and 148c may be formed at the opposite sides of the second mold gate structure 126b, respectively.

The first channel patterns 132 may be disposed between the first epitaxial pattern 148a and the second epitaxial patterns 148b. Opposite sidewalls of the first channel patterns 132 may be in direct contact with the first and second epitaxial patterns 148a and 148b.

The second channel patterns 134 may be disposed between the second epitaxial pattern 148b and the third epitaxial pattern 148c. Opposite sidewalls of the second channel patterns 134 may be in direct contact with the second and third epitaxial patterns 148b and 148c. Thus, the first through third epitaxial patterns 148a, 148b and 148c and the first and second channel patterns 132 and 134 may be connected in the first direction.

The first through third epitaxial patterns 148a, 148b and 148c may project in the second direction. Thus, the first through third epitaxial patterns 148a, 148b and 148c may be respectively connected to each other on the device isolation pattern 101. The first epitaxial patterns 148a may be connected to each other in the second direction. The second epitaxial patterns 148b may be connected to each other in the second direction, and the third epitaxial patterns 148c also may be connected to each other in the second direction. Thus, the first through third epitaxial patterns 148a, 148b and 148c may extend in the second direction.

The first through third epitaxial patterns 148a, 148b and 148c may be formed by performing a selective epitaxial growth (SEG) process using the surfaces of the exposed substrate 100 and the first and second channel patterns 132 and 134 as a seed.

In some exemplary embodiments, the first through third epitaxial patterns 148a, 148b and 148c may include silicon or silicon germanium.

In some exemplary embodiments, when performing the epitaxial growth process, impurities may be doped in-situ. Thus, the first through third epitaxial patterns 148a, 148b and 148c may act as source/drain regions of the first and second transistors.

In some exemplary embodiments, after forming the first through third epitaxial patterns 148a, 148b and 148c, an impurity doping process and an annealing process may be further be performed to form the source/drain regions.

The second epitaxial pattern 148b may be disposed between the first mold gate structure 126a and the second mold gate structure 126b. Thus, the second epitaxial pattern 148a may be provided as a common impurity region of the first and second transistor.

Top surfaces of the first through third epitaxial patterns 148a, 148b and 148c may be higher than uppermost ones of the first and second channel patterns 132 and 134.

Referring to FIG. 19, an insulating liner layer 149 may be conformally formed on the first through third epitaxial patterns 148a, 148b and 148c, the first and second gate structures 126a and 126b and the first spacer 128. In some exemplary embodiments, the insulating liner layer 149 may act as an etching stopper. The insulating liner layer 149 may include, for example, silicon nitride.

A first insulating interlayer 150 may be formed on the insulating liner layer 149 and may fill a space between the first and second mold gate structures 126a and 126b. The first insulating interlayer 150 may include, for example, silicon oxide.

Referring to FIG. 20, upper portions of the first insulating interlayer 150, the hard mask 124, the insulating liner layer 149 and the first spacer 128 may be planarized until the top surfaces of the first and second mold gate patterns 122a and 122b are exposed. The planarization process may include a chemical mechanical polishing process and/or an etch-back process.

By performing the planarization process, the hard mask 124 may be substantially completely removed. An upper portion of each of the first insulating interlayer 150, the insulating liner layer 149 and the first spacer 128 may be partially removed.

Figure 21:
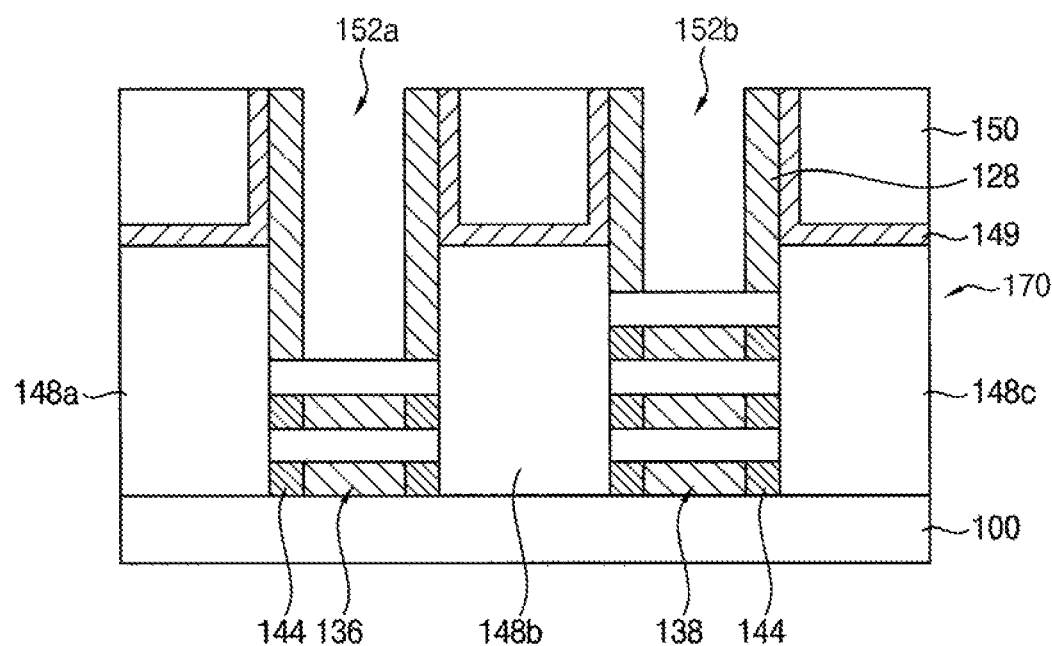
Figure 22:
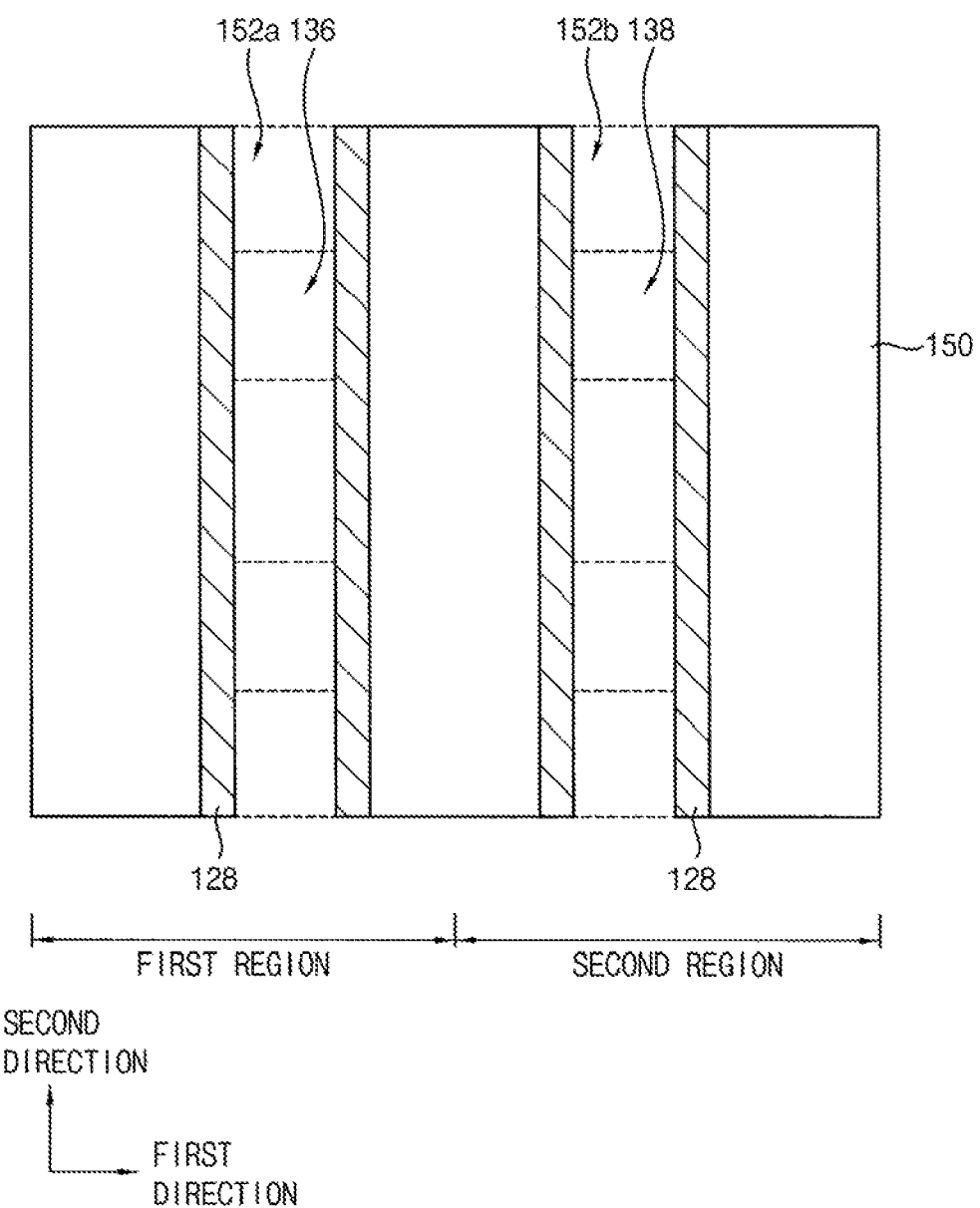

Referring to FIGS. 21 and 22, the first and second mold gate patterns 122a and 122b and the first and second mold gate insulating patterns 120a and 120b may be removed to form first and second openings 152a and 152b, respectively.

The first opening 152a may extend in the second direction while exposing a top surface and sidewalls of the first preliminary active structure 136. In the first opening 152a, a top surface of the uppermost one of the first channel patterns 132, inner sidewalls of the first spacer 128 and opposite sidewalls of the first channel patterns 132 and the first semiconductor patterns 130 may be exposed.

The second opening 152b may extend in the second direction while exposing a top surface and sidewalls of the second preliminary active structure 138. In the second opening 152b, a top surface of the uppermost one of the second channel patterns 134, inner sidewalls of the first spacer 128 and opposite sidewalls of the second channel patterns 134 and the first semiconductor patterns 130 may be exposed.

Referring to FIG. 23, the first semiconductor patterns 130 in the first and second preliminary active structures 136 and 138 may be selectively removed.

The first semiconductor patterns 130 may be removed by an isotropic etching process. Thus, the first channel patterns 132 may be spaced apart from each other in the third direction, and first tunnels 139a may be formed between the first channel patterns 132. The second channel patterns 134 may be spaced apart from each other in the third direction, and second tunnels 139b may be formed between the second channel patterns 134.

Thus, an active structure 170 that includes a first active structure 20, which may be used to form the first transistor and a second active structure 22, which may be used to form the second transistor, may be formed. The first active structure 20 may include the first and second epitaxial patterns 148a and 148b and a stack of the first channel patterns 132 disposed between the first and second epitaxial patterns 148a and 148b. The second active structure 22 may include the second and third epitaxial patterns 148b and 148c and a stack of the second channel patterns 134 between the second and third epitaxial patterns 148b and 148c. The number of stacked second channel patterns 134 may be greater than that of stacked first channel patterns 132.

Figure 24:
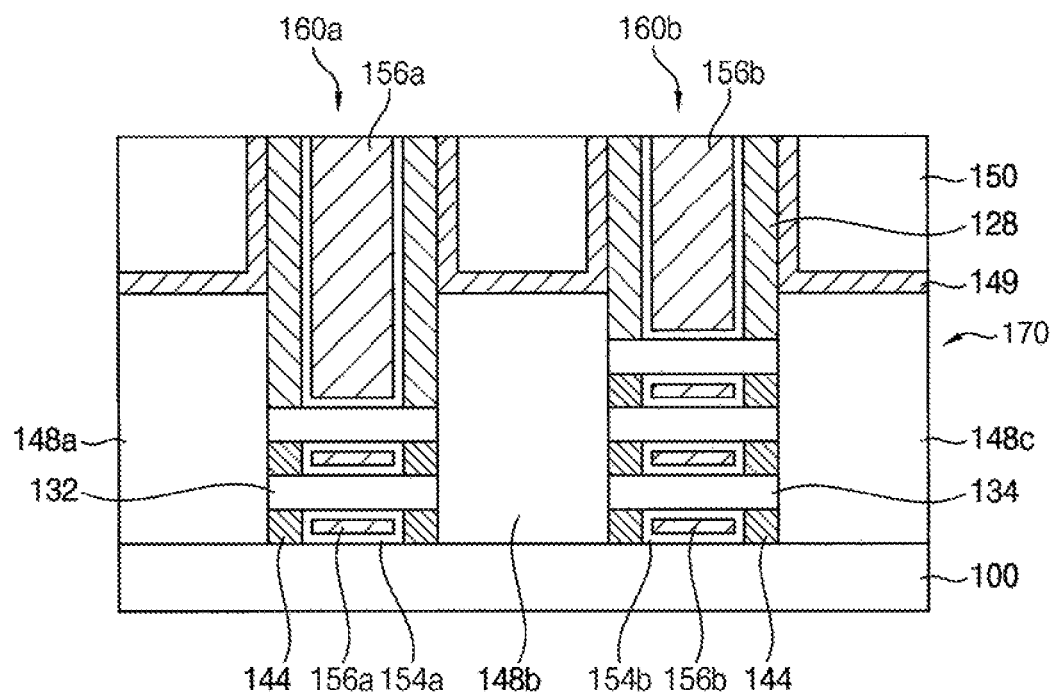
Figure 25:
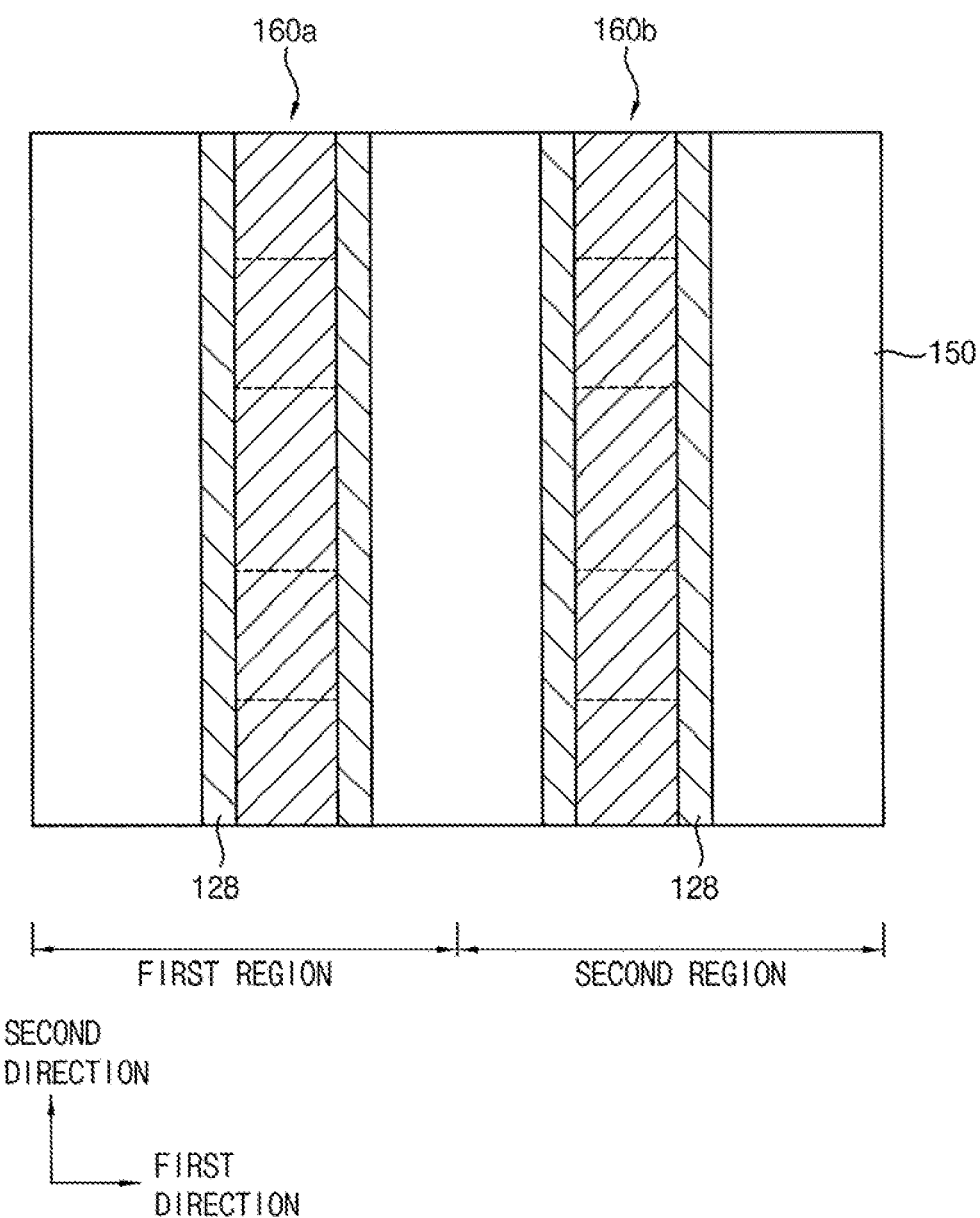

Referring to FIGS. 24 and 25, a first preliminary gate structure 160a and a second preliminary gate structure 160b may be formed to fill the first opening 152a and the second opening 152b, respectively.

A gate insulating layer may be conformally formed on the first spacer 128 exposed in the first and second openings 152a and 152b, the first and second channel pattern 132 and 134, the second spacer 144, the device isolation pattern 101 and the first insulating interlayer 150. The gate insulating layer may include a metal oxide material having a higher dielectric constant than silicon nitride. The gate insulating layer may include, for example, hafnium oxide ($HfO_2$), tantalum oxide ($Ta_2O_5$) and zirconium oxide ($ZrO_2$).

A gate electrode layer may be formed on the gate insulating layer and may substantially completely fill the first and second openings 152a and 152b.

In some exemplary embodiments, the gate electrode layer may include a threshold voltage control layer and a metal layer. The threshold voltage control layer may be in direct contact with the gate insulating layer and may have a work function depending on a desired threshold voltage of the transistor.

In some exemplary embodiments, the threshold voltage control layer may include titanium, titanium nitride and/or titanium aluminum nitride. The work function may be controlled by a combination of metals included in the threshold voltage control layer. The metal layer may include, for example, metal such as aluminum (Al), copper (Cu) or tantalum (Ta) and/or metal nitride thereof.

The gate electrode layer and the gate insulating layer may be planarized until the top surface of the first insulating interlayer 150 is exposed, such that the first and second preliminary gate structures 160a and 160b may be formed in the first and second openings 152a and 152b, respectively.

The first preliminary gate structure 160a may include a first gate insulating pattern 154a and a first preliminary gate electrode 156a, and the second preliminary structure 160b may include a second gate insulating pattern 154b and a second preliminary gate electrode 156b.

Figure 26:
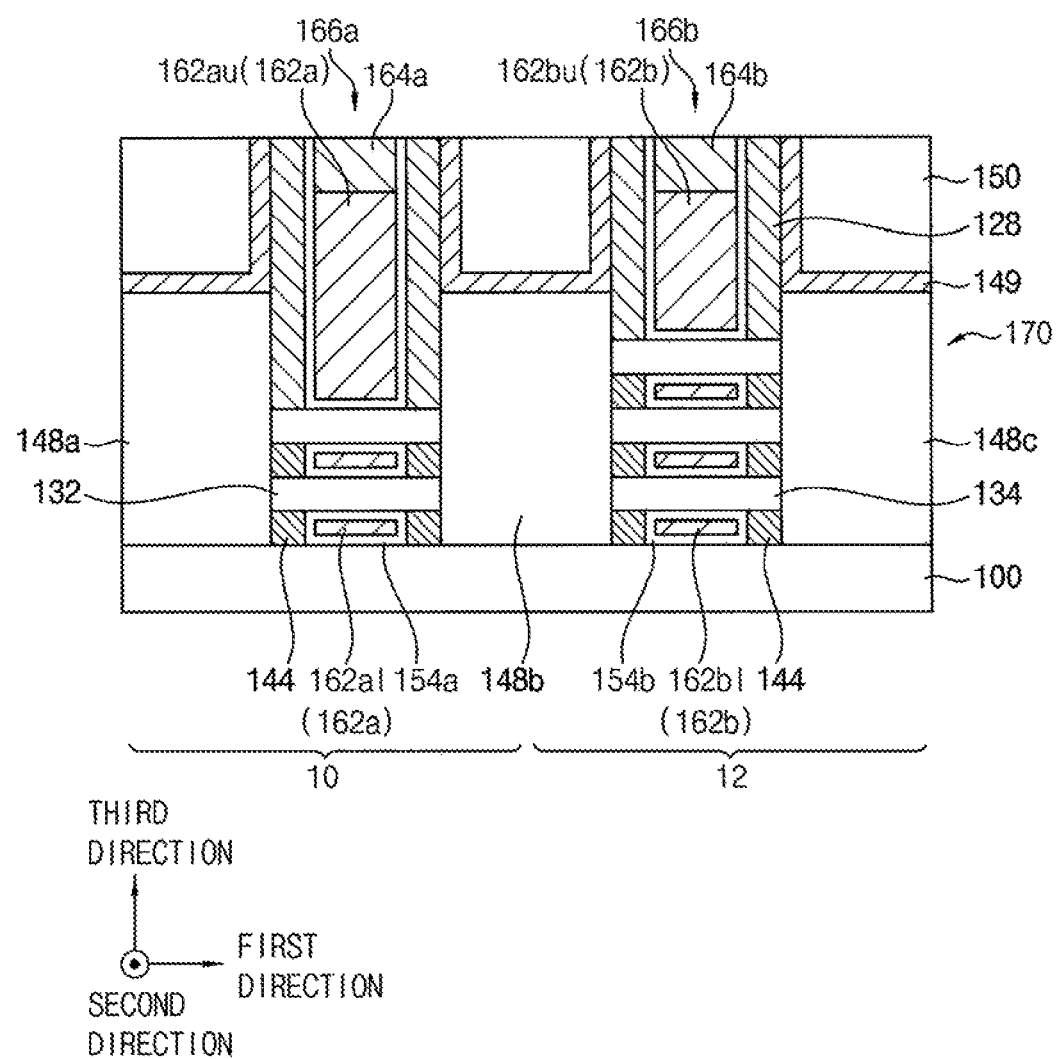

Referring to FIG. 26, the first and second preliminary electrodes 156a and 156b positioned in the upper portion of the first and second openings 152a and 152b may be partially etched to form first and second gate electrode 162a and 162b. A hard mask layer filling the etched portions may be formed and then may be planarized to form first and second hard masks 164a and 164b.

Thus, a first gate structure 166a, in which the first gate insulating pattern 154a, the first gate electrode 162a and the first hard mask 164a are stacked, may be formed on the first active structure 20. A second gate structure 166b, in which the second gate insulating pattern 154b, the second gate electrode 162b and the second hard mask 164b are stacked, may be formed on the second active structure 22.

The first gate electrode 162a may include a first lower gate pattern 162a1 formed in the first tunnels 139a and a first upper gate pattern 162au formed on the uppermost one of the first channel patterns 132. The second gate electrode 162b may include a second lower gate pattern 162b1 formed in the second tunnels 139b and a second upper gate pattern 162bu formed on the uppermost one of the second channel patterns 134.

Thus, the first transistor 10 including the first active structure 20 and the first gate structure 166a and the second transistor 20 including the second active structure 22 and the second gate structure 166b may be formed.

Figure 27:
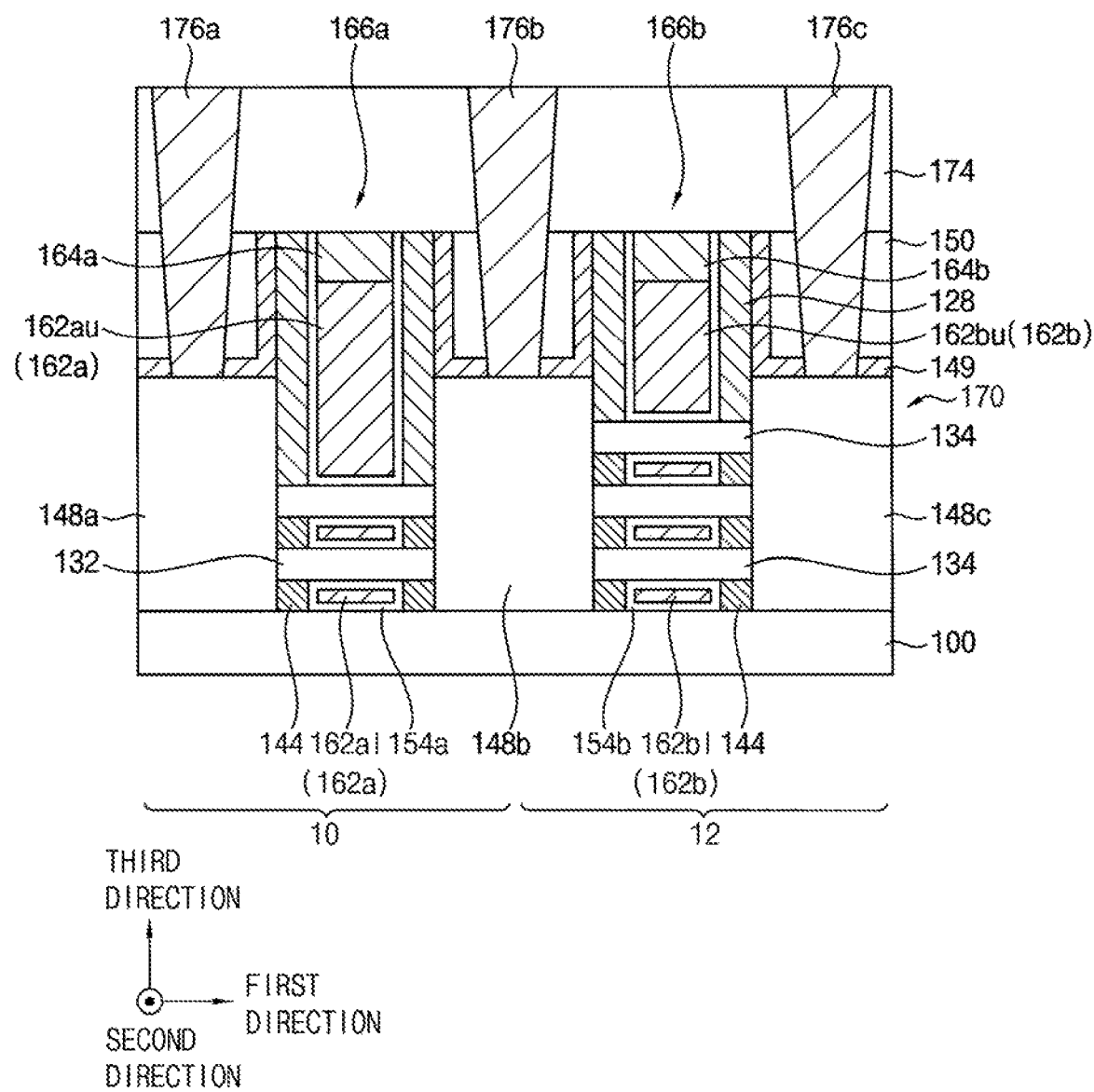

Referring to FIG. 27, a second insulating interlayer 174 may be formed on the first insulating interlayer 150 and the first and second gate structures 166a and 166b.

The second insulating interlayer 174 may include, for example, silicon oxide and may be formed by a chemical vapor deposition process.

First through third contact plugs 176a, 176b and 176c may be formed to penetrate the second insulating interlayer 174 and to contact the first through epitaxial patterns 148a, 148b and 148c, respectively.

The formation of the first through third contact plugs 176a, 176b and 176c may include etching a portion of the second insulating interlayer 174 to form first through third contact holes that expose the top surfaces of the first through third epitaxial patterns 148a, 148b and 148c, respectively, forming a conductive layer in the first through third contact holes and planarizing the conductive layer.

The first through third contact plugs 176a, 176b and 176c may be in direct contact with the impurity regions of the first and second transistors 10 and 12. The second contact plug 176b may be in direct contact with the common impurity region of the first and second transistors 10 and 12.

According to an exemplary embodiment of the present inventive concept, the first and second transistors (e.g., the first transistor 10 and the second transistor 12) that have different electrical characteristics from each other may be adjacent each other on the substrate (e.g., the substrate 100). Since the first and second transistors may include different numbers of the channel patterns from each other, the first and second transistors may have different electrical characteristics from each other. For example, since the second transistor may include a relatively larger number of the channel patterns than that of the first transistor, the second transistor may have a relatively high operating current characteristics compared to the first transistor.

Figure 28:
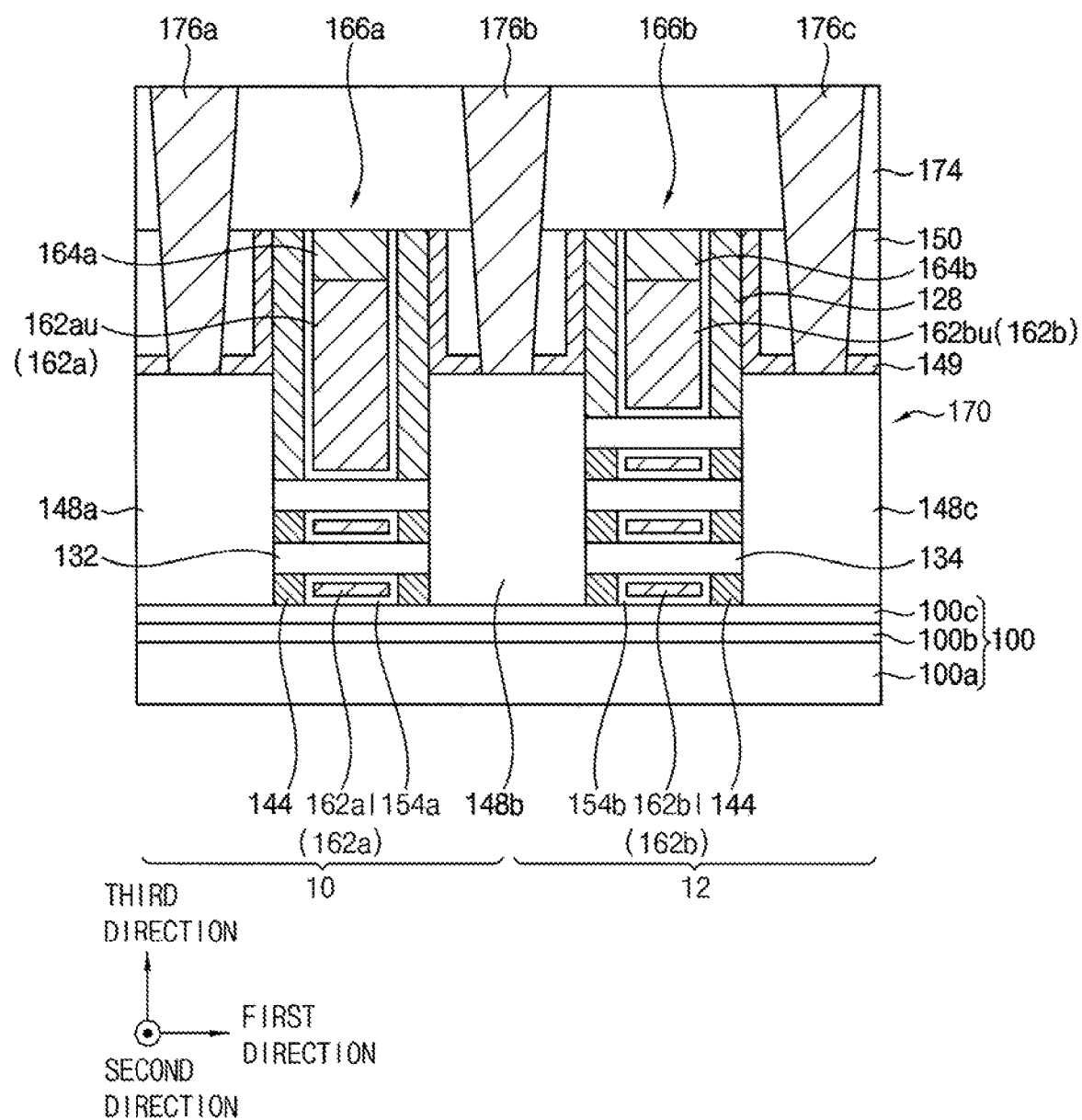
FIG. 28 is a cross-sectional view illustrating a semiconductor device according to an exemplary embodiment of the present inventive concept.

FIG. 28 is a cross-sectional view illustrating a semiconductor device according to an exemplary embodiment of the present inventive concept.

The semiconductor device may be substantially the same as the semiconductor device described with reference to FIGS. 1A, 1B and 2 except that the substrate is a silicon-on-insulator (SOI) substrate or a silicon germanium-on-insulator (SGOI) substrate, and thus duplicative descriptions may be omitted.

Referring to FIG. 28, the substrate 100 may include a semiconductor layer 100c in an upper part of the substrate 100 and an insulating layer 100b under the semiconductor 100c in the substrate 100. The substrate 100 may include a bulk substrate 100a under the insulating layer 100b in the substrate 100. In some exemplary embodiments, the substrate 100 may be an SOI substrate in which the semiconductor layer 100c includes single crystal silicon and the insulating layer 100b includes silicon oxide. The semiconductor device described in more detail above with reference to FIGS. 1A, 1B and 2 may be disposed on the substrate 100.

Figure 29:
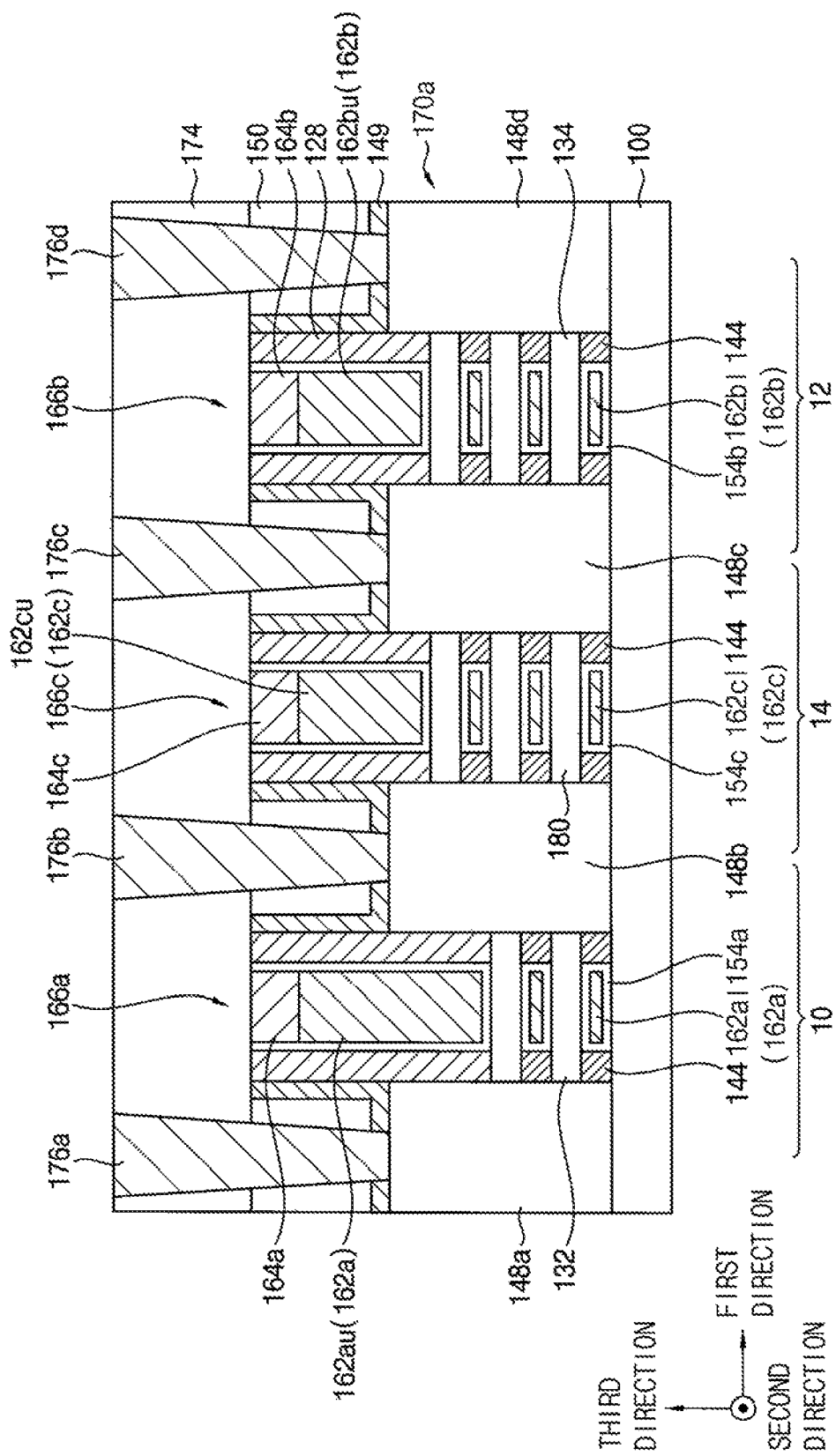
FIG. 29 is a cross-sectional view illustrating a semiconductor device according to an exemplary embodiment of the present inventive concept.
Figure 30:
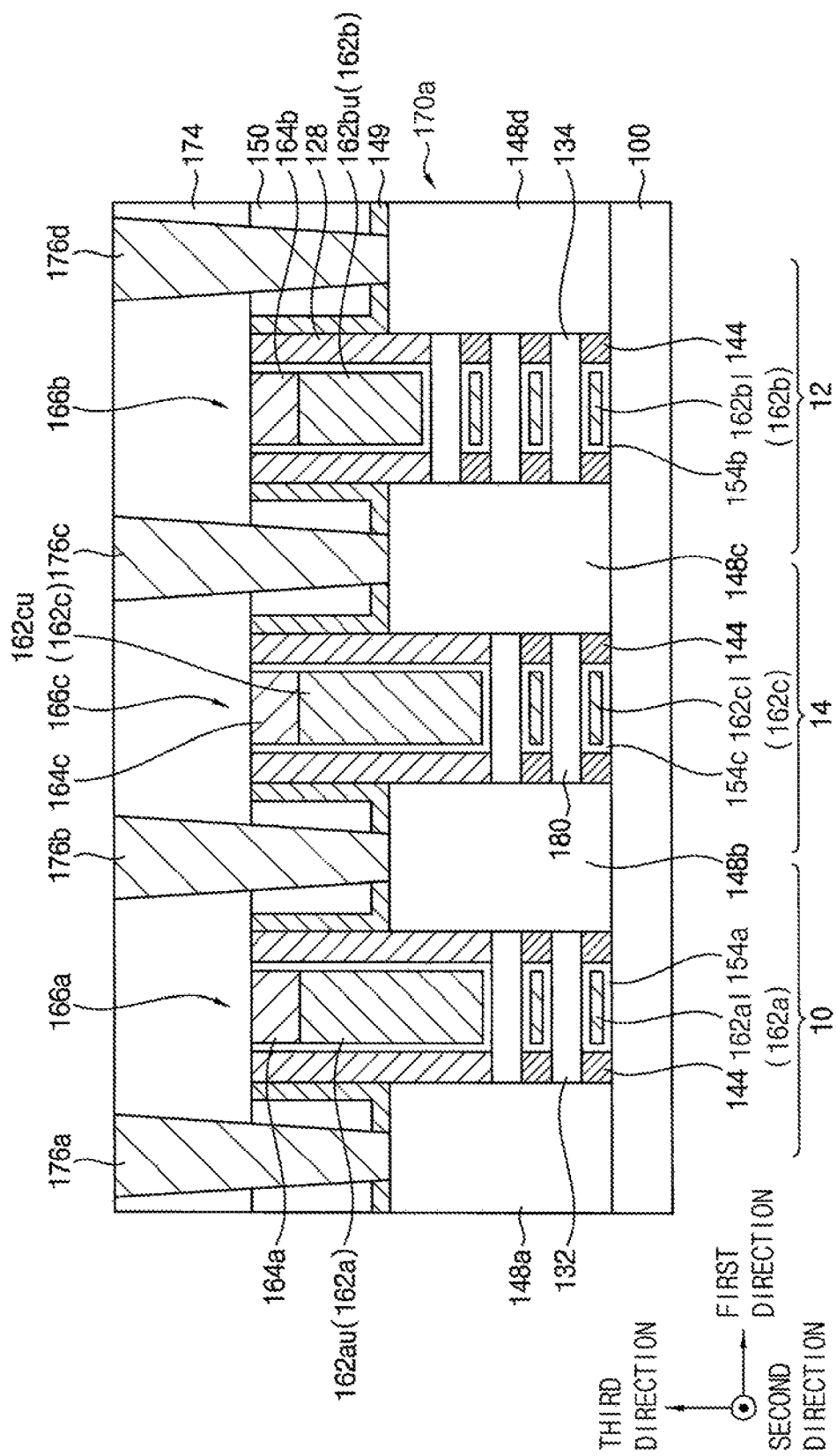
FIG. 30 is a cross-sectional view illustrating a semiconductor device according to an exemplary embodiment of the present inventive concept.

FIG. 29 is a cross-sectional view illustrating a semiconductor device according to an exemplary embodiment of the present inventive concept. FIG. 30 is a cross-sectional view illustrating a semiconductor device according to an exemplary embodiment of the present inventive concept.

Referring to FIG. 29, first and second transistors 10 and 12 that are different from each other in an electrical characteristic may be disposed on a substrate 100. A dummy transistor 14 may be disposed between the first transistor 10 and the second transistor 12. A first impurity region of the dummy transistor 14 may be a second impurity region of the first transistor 10, and a second impurity region of the dummy transistor 14 may be a first impurity region of the second transistor 12.

In some exemplary embodiments, the substrate 100 may include a semiconductor material such as silicon, germanium or silicon-germanium, or a III-V group compound semiconductor.

In some exemplary embodiments, the substrate 100 may be a silicon-on-insulator (SOI) substrate or a silicon germanium-on-insulator (SGOI) substrate. The substrate 100 may include a semiconductor material layer as a part of an upper portion thereof and an insulating material layer under the semiconductor material layer.

A first active structure, which may be used to form the first transistor 10 and a second active structure, which may be used to form the second transistor 12, may be disposed on the substrate 100. A dummy active structure, which may be used to form the dummy transistor 14, may be disposed between the first active structure and the second active structure. Thus, the first and second active structures may be spaced apart from each other in the first direction.

The first active structure, the dummy active structure and the second active structure may be connected to each other and may extend in the first direction, thus forming one active structure 170a. In some exemplary embodiments, a plurality of active structures 170a may be arranged in the second direction. Channel patterns in each of the active structures 170a may be respectively arranged adjacent to each other in the second direction.

The first active structure may include a first epitaxial pattern 148a, a second epitaxial pattern 148b and a plurality of first channel patterns 132 between the first epitaxial pattern 148a and the second epitaxial pattern 148b. The first and second epitaxial patterns 148a and 148b may act as the first and second impurity regions (e.g., source/drain regions) of the first transistor 10. The first active structure may be substantially the same as the first active structure 20 described in more detail with reference to FIGS. 1A, 1B and 2.

The first transistor 10 formed on the first active structure may be substantially the same as the first transistor 10 described in more detail with reference to FIGS. 1A, 1B and 2. The first gate structure 166a formed on the first active structure may be substantially the same as the first gate structure 166a described in more detail with reference with FIGS. 1A, 1B and 2.

The second active structure may include a third epitaxial pattern 148c, a fourth epitaxial pattern 148d and a plurality of second channel patterns between the third epitaxial pattern 148c and the fourth epitaxial pattern 148d. The third epitaxial pattern 148c may be spaced apart from the second epitaxial pattern 148b in the first direction. The third and fourth epitaxial patterns 148c and 148d may act as the first and second impurity regions (e.g., source/drain regions) of the second transistor 12.

The epitaxial patterns of the first and second active structures need not be shared. The second active structure may be substantially the same as the second active structure 22 described in more detail with reference to FIGS. 1A, 1B and 2 except that the second structure does not share the second epitaxial pattern with the first active structure.

The second transistor 12 formed on the second active structure may be substantially the same as the second transistor 12 described in more detail with reference to FIGS. 1A, 1B and 2. The second gate structure 166b formed on the second active structure may be substantially the same as the second gate structure 166b described in more detail with reference to FIGS. 1A, 1B and 2.

In some exemplary embodiments, the number of stacked second channel patterns 134 in the third direction may be different from the number of stacked first channel patterns 132 in the third direction. In some exemplary embodiments, the number of stacked second channel patterns 134 may be greater than the number of stacked first channel patterns 132.

Thus, the number of the channel patterns of the second transistor 12 may be greater than the number of the channel patterns of the first transistor 10. An operating current of the second transistor 12 may be greater than an operating current of the first transistor 10.

The dummy active structure may include the second epitaxial pattern 148b, the third epitaxial pattern 148c and a plurality of dummy channel patterns 180 between the second epitaxial pattern 148b and the third epitaxial pattern 148c. In some exemplary embodiments, the number of stacked dummy channel patterns 180 may be the same as the number of stacked second channel patterns 134. In some exemplary embodiments, the shape of the dummy channel patterns 180 may be substantially the same as the shape of the second channel patterns 134.

The dummy active structure may share the second epitaxial pattern 148b and the third epitaxial pattern 148c with the first active structure and the second active structure.

A dummy gate structure 166c may surround the dummy channel patterns 180 and may extend in the second direction. The dummy gate structure 166c may include a dummy gate insulating pattern 154c, a dummy gate electrode 162c and a third hard mask 164c.

In some exemplary embodiments, the dummy gate structure 166c may be substantially the same as the second gate structure 166b.

In some exemplary embodiments, referring to FIG. 30, the number of stacked dummy channel patterns 180 may be the same as the number of stacked first channel patterns 132; and the shape of the dummy channel patterns 180 may be the same as the shape of the first channel patterns 132. In this case, the dummy gate structure 166c may be substantially the same as the first gate structure 166a.

Top surfaces of the first and second gate structures 166a and 166b may be substantially coplanar with a top surface of the dummy gate structure 166c.

The dummy transistor 14 may be disposed between the first transistor 10 and the second transistor 12 and need not substantially perform a switching operation.

A first contact plug 176a and a second contact plug 176b may be in direct contact with the first epitaxial pattern 148a and the second epitaxial pattern 148b, respectively.

A third contact plug 176c and a fourth contact plug 176d may be in direct contact with the third epitaxial pattern 148c and the fourth epitaxial pattern 148d, respectively.

Figure 31:
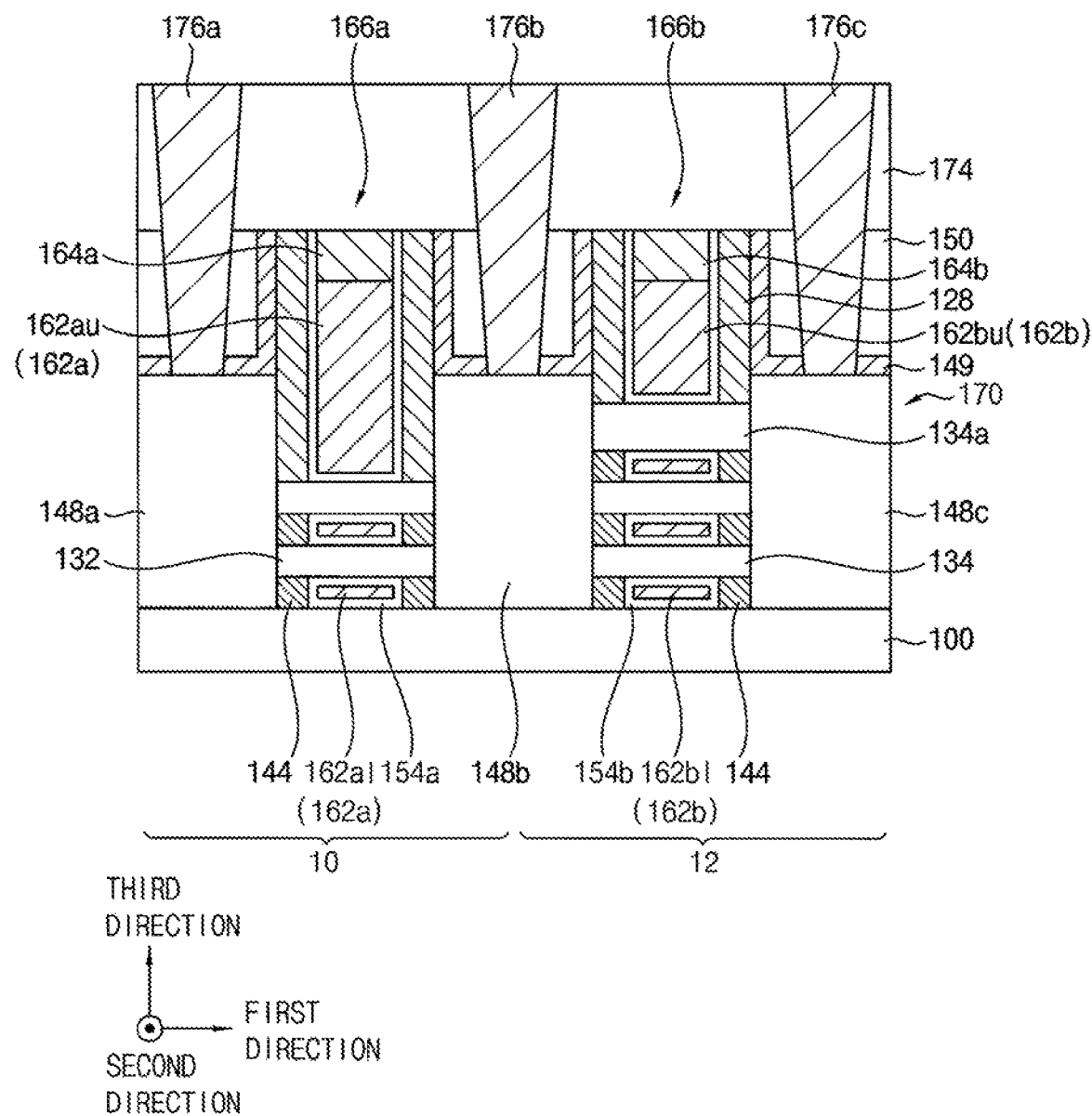
FIG. 31 is a cross-sectional view illustrating a semiconductor device according to an exemplary embodiment of the present inventive concept.

FIG. 31 is a cross-sectional view illustrating a semiconductor device according to an exemplary embodiment of the present inventive concept.

Referring to FIG. 31, first and second transistors 10 and 12 that are different from each other in an electrical characteristic may be disposed on a substrate 100. The first and second transistors 10 and 12 may be adjacent each other. In some exemplary embodiments, the first and second transistors 10 and 12 may share one impurity region.

In some exemplary embodiments, the substrate 100 may include a semiconductor material such as silicon, germanium or silicon-germanium, or a III-V group compound semiconductor.

In some exemplary embodiments, the substrate 100 may be a silicon-on-insulator (SOI) substrate or a silicon germanium-on-insulator (SGOI) substrate. The substrate 100 may include a semiconductor material layer as a part of an upper portion thereof and an insulating material layer under the semiconductor material layer.

A first active structure may be used to form a first transistor and a second active structure may be used to form a second transistor. A portion of the second active structure may be shared with the first active structure.

The first and second active structures may be connected to each other, thereby forming one active structure 170. In some exemplary embodiments, a plurality of active structures 170 may be arranged in the second direction. Channel patterns of the active structures 170 may be respectively arranged adjacent to each other in the second direction.

The first active structure may include a first epitaxial pattern 148a, a second epitaxial pattern 148b and first channel patterns 132 between the first epitaxial pattern 148a and the second epitaxial pattern 148b. The first channel patterns 132 may include a plurality of channel patterns that are spaced apart from each other in the third direction. In some exemplary embodiments, each of the first channel patterns 132 may have substantially the same first thickness as each other in the third direction.

The first transistor 10 formed on the first active structure may be substantially the same as the first transistor 10 described in more detail with reference to FIGS. 1A, 1B and 2. A first gate structure 166a formed on the first active structure may be substantially the same as the first gate structure 166a described in more detail with reference to FIGS. 1A, 1B and 2.

The second active structure may include a second epitaxial pattern 148b, a third epitaxial pattern 148c and a plurality of second channel patterns 134 and 134a disposed between the second epitaxial pattern 148b and the third epitaxial pattern 148c.

The second channel patterns 134 and 134a may be spaced apart from each other in the third direction. A number of stacked second channel patterns 134 and 134a in the third direction may be different from the number of stacked first channel patterns 132 in the third direction. In some exemplary embodiments, the number of stacked second channel patterns 134 and 134a in the third direction may be greater than the number of stacked first channel patterns 132 in the third direction.

At least one of the second channel patterns 134 and 134a may have a different thickness from the other second channel patterns 134 and 134a. In some exemplary embodiments, an uppermost one 134a of the second channel patterns 134 and 134a may have a different thickness from the other second channel patterns 134. For example, the second channel patterns 134 under the uppermost second channel pattern 134a may have a first thickness in the third direction, and the uppermost second channel pattern 134a may have a second thickness greater than the first thickness.

The second transistor 12 formed on the second active structure may be substantially the same as the second transistor 12 described in more detail with reference to FIGS. 1A, 1B and 2. A second gate structure 166b formed on the second active structure may be substantially the same as the second gate structure 166b described in more detail with reference to FIGS. 1A, 1B and 2.

First through third contact plugs 176a, 176b and 176c may be in direct contact with the first through third epitaxial patterns 148a, 148b and 148c, respectively.

The first and second transistors 10 and 12 may have different electrical characteristics due to different stack numbers and different thicknesses of the channel patterns.

The semiconductor device may be manufactured by performing substantially the same processes as those described in more detail with reference to FIGS. 3 through 27. However, when forming the first preliminary semiconductor structure, a thickness of the second semiconductor layer may be controlled depending on the thicknesses of the first and second channel patterns. For example, the uppermost second semiconductor layer may be formed thicker than the second semiconductor layers under the uppermost second semiconductor layer, and thus the semiconductor device shown in FIG. 31 may be manufactured.

Figure 32:
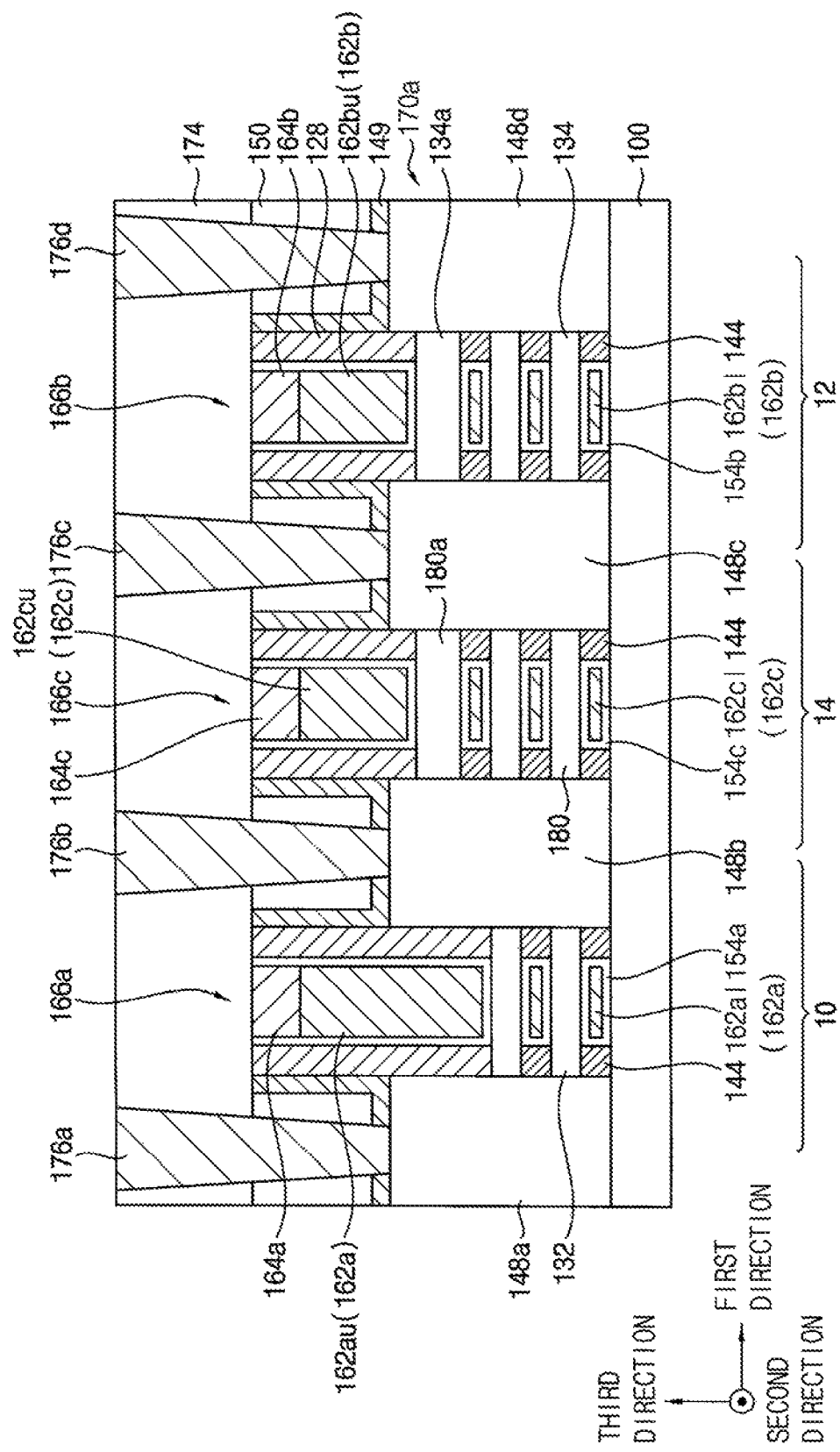
FIG. 32 is a cross-sectional view illustrating a semiconductor device according to an exemplary embodiment of the present inventive concept.

FIG. 32 is a cross-sectional view illustrating a semiconductor device according to an exemplary embodiment of the present inventive concept.

Referring to FIG. 32, first and second transistors 10 and 12 having different electrical characteristics may be disposed on a substrate 100. A dummy transistor 14 may be disposed between the first and second transistors 10 and 12. A first impurity region of the dummy transistor 14 may be a second impurity region of the first transistor 10, and a second impurity region of the dummy transistor 14 may be a first impurity region of the second transistor 12.

A first active structure, which may be used to form the first transistor 10 and a second active structure, which may be used to form the second transistor 12 may be disposed on the substrate 100. A dummy active structure may be disposed between the first and second active structures. Thus, the first active structure and the second active structure may be spaced apart from each other in the first direction.

The first active structure, the dummy active structure and the second active structure may be connected to each other and may extend in the first direction, thereby forming one active structure 170a. In some exemplary embodiments, a plurality of the active structure 170a may be arranged parallel to each other in the second direction. Channel patterns in the active structures 170a may be respectively arranged adjacent to each other in the second direction.

The first active structure may include a first epitaxial pattern 148a, a second epitaxial pattern 148b and a plurality of first channel patterns 132 between the first epitaxial pattern 148a and the second epitaxial pattern 148b. The first and second epitaxial patterns 148a and 148b may act as the first and second impurity regions (e.g., source/drain regions) of the first transistor 10. The first active structure may be substantially the same as the first active structure 20 described in more detail with reference to FIGS. 1A, 1B and 2.

The first transistor 10 that is formed on the first active structure may be substantially the same as the first transistor 10 described in more detail with reference to FIGS. 1A, 1B and 2.

The second active structure may include a third epitaxial pattern 148c, a fourth epitaxial pattern 148d and a plurality of second channel patterns 134 and 134a disposed between the third epitaxial pattern 148c and the fourth epitaxial pattern 148d. The third epitaxial pattern 148c may be spaced apart from the second epitaxial pattern 148b in the first direction. The third and fourth epitaxial patterns 148c and 148d may act as the first and second impurity regions (e.g., source/drain regions) of the second transistor 12.

The epitaxial patterns of the first and second active structures need not be shared. However, the second active structure may be substantially the same as the second active structure described with reference to FIG. 31 except that the second epitaxial pattern is not shared.

In some exemplary embodiments, the number of stacked second channel patterns 134 and 134a in the third direction may be different from the number of stacked first channel patterns 132 in the third direction. In some exemplary embodiments, the number of stacked second channel patterns 134 and 134a may be greater than the number stacked first channel patterns 132.

At least one of the second channel patterns 134 and 134a may have a different thickness from the other second channel patterns 134 and 134a. For example, the first channel patterns 132 and the second channel patterns 134 under an uppermost second channel pattern 134a may respectively have a first thickness. Also, the uppermost second channel pattern 134a may have a second thickness greater than the first thickness.

The second transistor 12 formed on the second active structure may be substantially the same as the second transistor 12 described in more detail with reference to FIGS. 1A, 1B and 2.

The dummy active structure may include the second epitaxial pattern 148b, the third epitaxial pattern 148c and dummy channel patterns 180 and 180a disposed between the second epitaxial pattern 148b and the third epitaxial pattern 148c. In some exemplary embodiments, the number of dummy channel patterns 180 and 180a may be the same as the number of second channel patterns 134 and 134a. The dummy channel patterns 180 and 180a corresponding to the respective second channel patterns 134 and 134a at a same position level may have substantially the same thickness as the second channel patterns 134 and 134a.

The dummy active structure may share the second and third epitaxial patterns 148b and 148c with the first and second active structures.

A dummy gate structure 166c may surround the dummy channel patterns 180 and 180a and may extend in the second direction. The dummy gate structure 166c may include a dummy gate insulating pattern 154c, a dummy gate electrode 162c and a third hard mask 164c.

In some exemplary embodiments, the dummy gate structure 166c may be substantially the same as a second gate structure 166b. The second gate structure 166b may be substantially the same as the second gate structure 166b described in more detail with reference to FIGS. 1A, 1B and 2.

In other exemplary embodiments, the number of dummy channel patterns 180 and 180a may be the same as the number of first channel patterns 132. In this case, the dummy gate structure 166c may be substantially the same as a first gate structure 166a. The first gate structure 166a may be substantially the same as the first gate structure 166a described in more detail with reference to FIGS. 1A, 1B and 2.

Top surfaces of the first and second gate structures 166a and 166b may be substantially coplanar with a top surface of the dummy gate structure 166c.

The dummy transistor 14 may be disposed between the first transistor 10 and the second transistor 12 and need not substantially perform a switching operation.

A first contact plug 176a and a second contact plug 176b may be in direct contact with the first epitaxial pattern 148a and the second epitaxial pattern 148b, respectively. A third contact plug 176c and a fourth contact plug 176d may be in direct contact with the third epitaxial pattern 148c and the fourth epitaxial pattern 148d, respectively.

Figure 33:
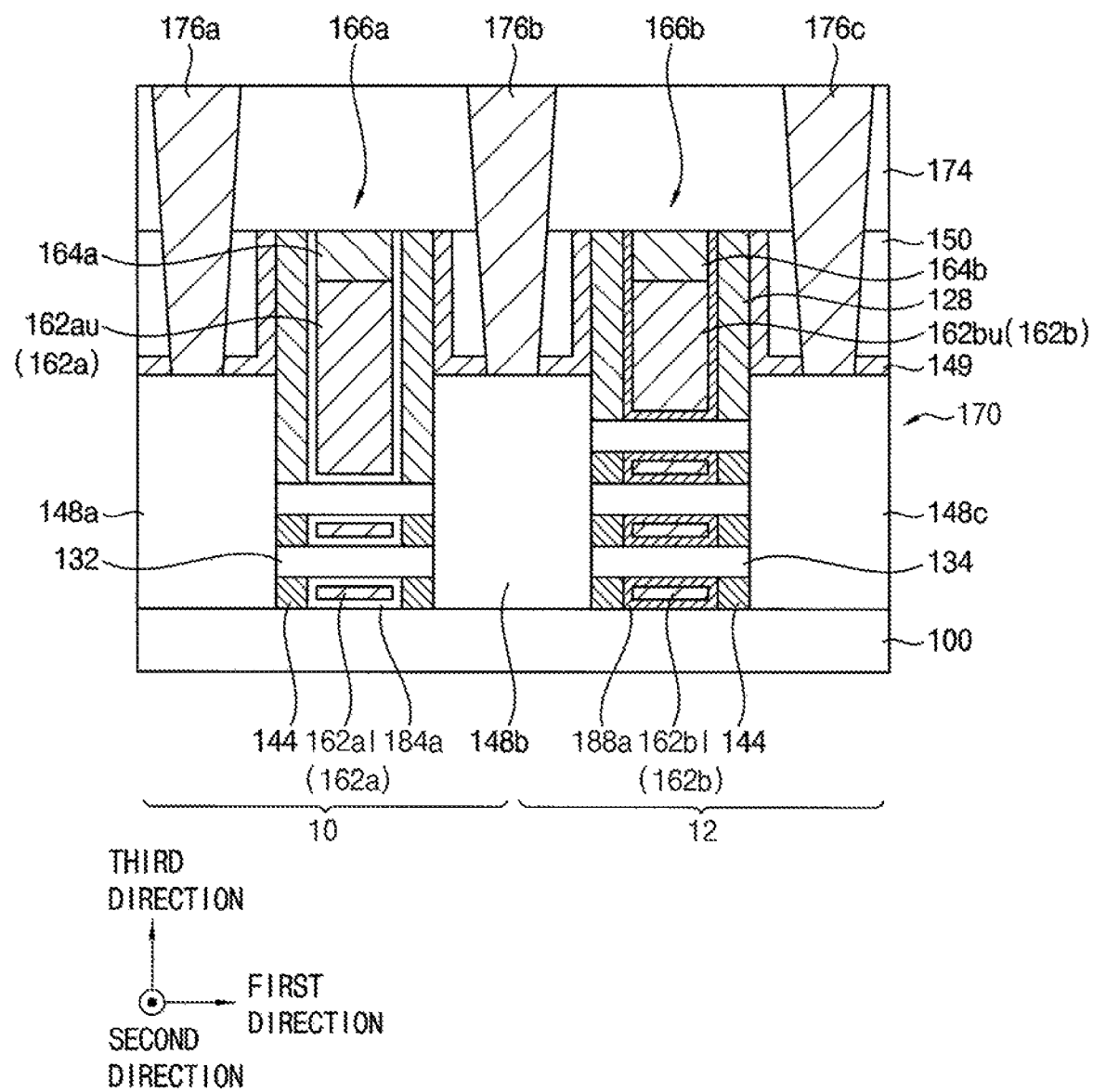
FIG. 33 is a cross-sectional view illustrating a semiconductor device according to an exemplary embodiment of the present inventive concept.
Figure 34:
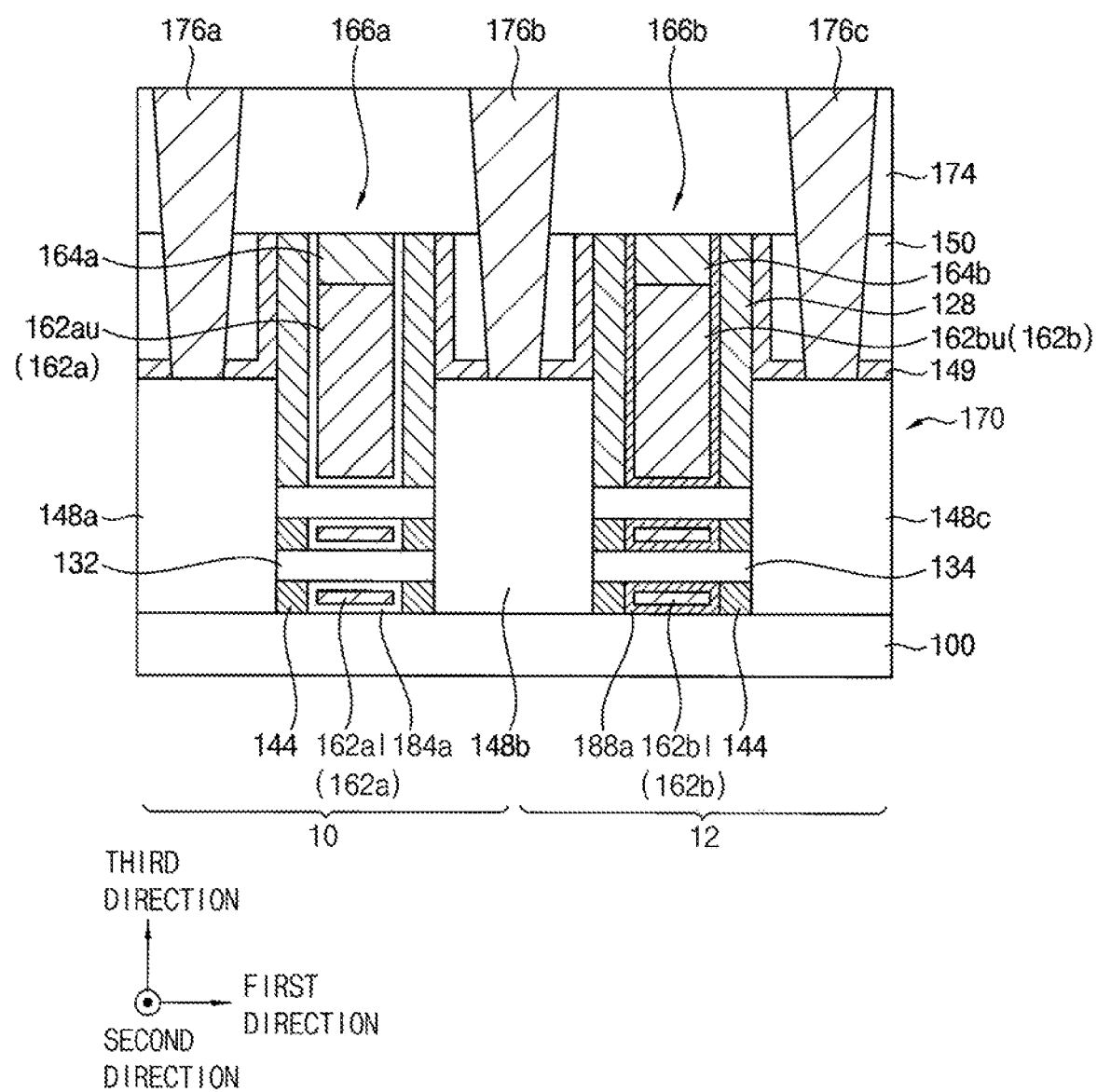
FIG. 34 is a cross-sectional view illustrating a semiconductor device according to an exemplary embodiment of the present inventive concept.

FIG. 33 is a cross sectional view illustrating a semiconductor device according to an exemplary embodiment of the present inventive concept. FIG. 34 is a cross sectional view illustrating a semiconductor device according to an exemplary embodiment of the present inventive concept.

Referring to FIG. 33, a semiconductor device according to an exemplary embodiment of the present inventive concept may be substantially the same as that the semiconductor device described with reference to FIGS. 1A, 1B and 2 except that a first gate insulating pattern and a second gate insulating pattern include different materials.

Referring to FIG. 33, a first transistor 10 and a second transistor 12 may respectively include the first gate insulating pattern 184a and the second gate insulating pattern 184b that include different materials. Thus, the first and second transistors 10 and 12 may have different electrical characteristics.

In some exemplary embodiments, the first transistor 10 and the second transistor 12 may include different numbers of stacked channel patterns (e.g. the number of stacked first channel patterns 132 and the number of stacked second channel patterns 134 may be different from each other)

In some exemplary embodiments, the first and second transistors 10 and 12 may include the same number of stacked channel patterns (e.g. the number of stacked first channel patterns 132 and the number of stacked second channel patterns 134 may be equal to each other)

FIGS. 35 through 37 are cross sectional views illustrating a method of manufacturing a semiconductor device according to an exemplary embodiment of the present inventive concept.

Active structures may be formed by performing the processes described in more detail with reference to FIGS. 3 through 23.

Referring to FIG. 35, a first mask pattern 182 may be formed to cover the active structure in the second region.

A first gate insulating layer 184 may be conformally formed on the first active structure, the first and second spacers 128 and 144, the first insulating interlayer 150 and the first mask pattern 182 that are formed in the first region. The first gate insulating layer 184 may include a first metal oxide material having a relatively high dielectric constant. The first gate insulating layer 184 may include hafnium oxide (HfO$_2$), tantalum oxide (Ta$_2$O$_5$) and/or zirconium oxide (ZrO$_2$).

Referring to FIG. 36, the first mask pattern 182 may be removed. The first gate insulating layer 184 on the first mask pattern 182 may also be removed. Accordingly, the first gate insulating layer 184 may be conformally formed on surfaces of the first channel patterns 132, the first and second spacers 128 and 144 and the first insulating interlayer 150.

A second mask pattern 186 may be formed to cover the active structure in the second region.

A second gate insulating layer 188 may be conformally formed on the second active structure, the first and second spacers 128 and 144, the first insulating interlayer 150 and the second mask pattern 186 that are formed in the second region. The second insulating layer 188 may include a second metal oxide material different from the first metal oxide material.

Referring to FIG. 37, the second mask pattern 186 may be removed. The second gate insulating layer 188 on the second mask pattern 188 may also be removed. Thus, the second gate insulating layer 188 may be conformally formed on surfaces of the second channel patterns 134, the first and second spacers 128 and 144 and the first insulating interlayer 150.

A gate electrode layer may be formed on the first and second gate insulating layers 184 and 188 to fill the first and second openings 152a and 152b. The gate electrode layer and the first and second gate insulating layers 184 and 188 may be planarized to expose a top surface of the first insulating interlayer 150 such that first and second preliminary gate structures 160a and 160b may be formed in the first and second gate openings 152a and 152b, respectively. The first and second preliminary gate structures 160a and 160b may include first and second gate insulating patterns 184a and 188a, respectively.

The semiconductor device described in more detail with reference to FIG. 32 may be manufactured by performing substantially the same processes as described in more detail with reference to FIGS. 26 and 27.

Figure 38:
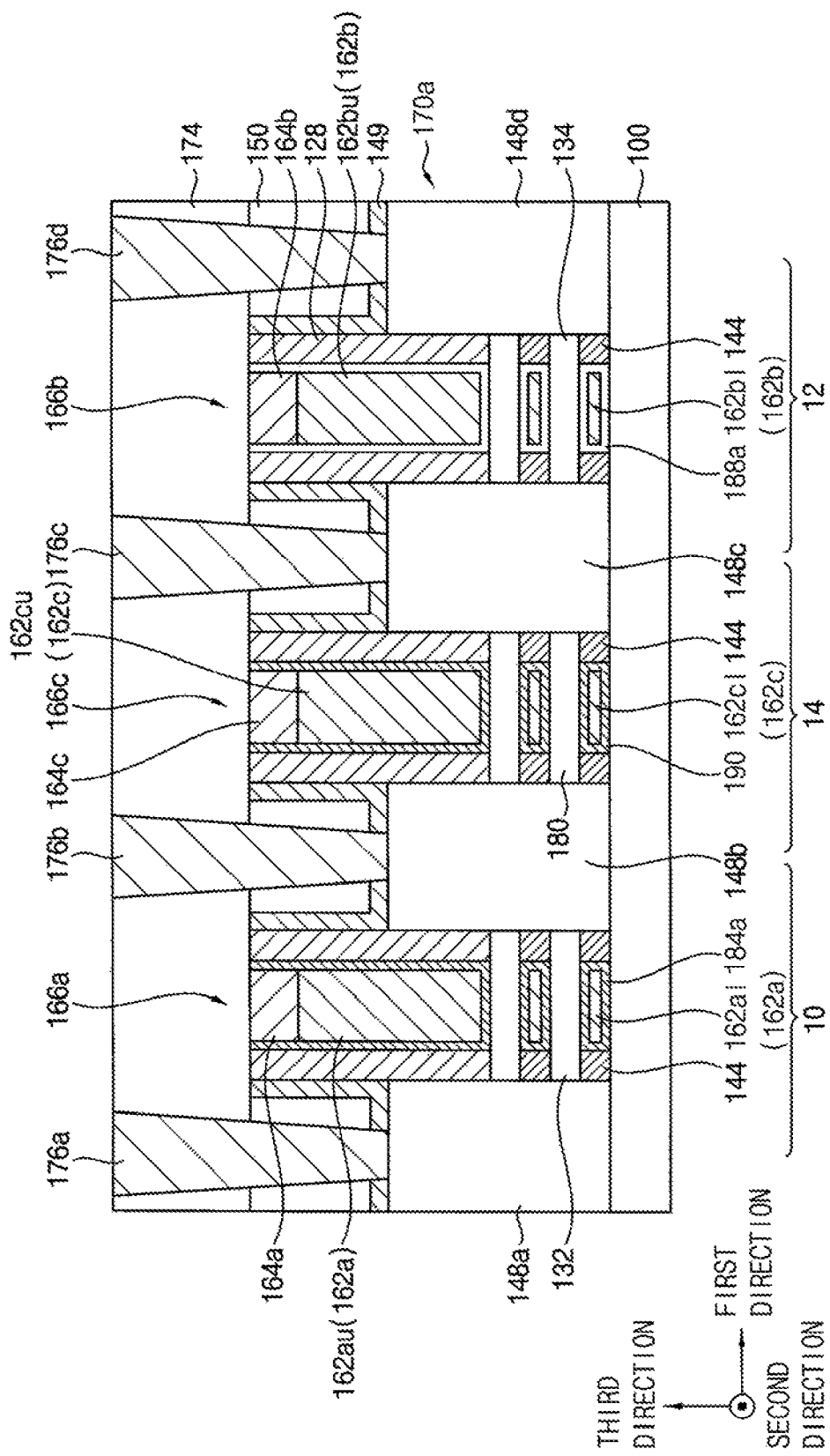
FIG. 38 is a cross-sectional view illustrating a semiconductor device according to an exemplary embodiment of the present inventive concept.

FIG. 38 is a cross sectional view illustrating a semiconductor device according to an exemplary embodiment of the present inventive concept.

Referring to FIG. 38, the semiconductor device according to an exemplary embodiment of the present inventive concept may include first and second transistors 10 and 12 that have different electrical characteristics and are formed on a substrate 100. The semiconductor device may include a dummy transistor 14 that is formed on the substrate 100 between the first transistor 10 and the second transistor 12.

For example, the first and second transistors 10 and 12 may be substantially the same as the first and second transistors 10 and 12 described in more detail with reference to FIG. 34. The first and second transistors 10 and 12 may include the same number of stacked channel patterns as each other. A first gate insulating pattern 184a and a second gate insulating pattern 184b may include different materials.

In some exemplary embodiments, the dummy transistor 14 may be substantially the same as the first transistor 10. In this case, a dummy gate insulating pattern 190 of the dummy transistor 14 may include the same material as the first gate insulating pattern 184a. In some exemplary embodiments, the dummy transistor 14 may be substantially the same as the second transistor 12. In this case, the dummy gate insulating pattern 190 of the dummy transistor 14 may include the same material as the second gate insulating pattern 188a.

In some exemplary embodiments, the first and second transistors 10 and 12 may be substantially the same as the first and second transistors 10 and 12 described with reference to FIG. 33. The first and second transistors 10 and 12 may include different numbers of stacked channel patterns from each other. In the first and second transistors 10 and 12, the first and second gate insulating patterns 184a and 188a may include different materials. In this case, the dummy transistor 14 may be substantially the same as the first transistor 10 or the second transistor 12.

The semiconductor device according to exemplary embodiments of the present inventive concept may include transistors that have different electrical characteristics and are disposed immediately adjacent to each other. The adjacent transistors can respectively have desired electrical characteristics without affecting each other. A dummy gate or a separation pattern such as a device isolation pattern might not be included between the transistors having different electrical characteristics, and thus a space between the transistors can be reduced. Thus, the semiconductor device according to exemplary embodiments of the present inventive concept may be highly integrated.

The semiconductor device according to exemplary embodiments of the present inventive concept may be applied to a memory device or a logic device.

While the present inventive concept has been particularly shown and described with reference to exemplary embodiments thereof, it will be understood by those of ordinary skill in the art that various changes in form and details may be made therein without departing from the spirit and scope of the present inventive concept.

What is claimed is:
1. A method of manufacturing a semiconductor device, comprising:
forming a first semiconductor structure in which first semiconductor patterns and first channel patterns are alternately and repeatedly stacked on a substrate, the first semiconductor structure having a first number of stacked first channel patterns;
forming a second semiconductor structure in which second semiconductor patterns and second channel patterns are alternately and repeatedly stacked on the substrate, the second semiconductor structure having a second number of stacked second channel patterns different from the first number of stacked first channel patterns, wherein the first semiconductor structure is spaced apart from the second semiconductor structure in a first direction parallel to a top surface of the substrate;
forming a first epitaxial pattern on a first sidewall of the first semiconductor structure;
forming a second epitaxial pattern between a second sidewall of the first semiconductor structure and a first sidewall of the second semiconductor structure facing the second sidewall of the first semiconductor structure;
forming a third epitaxial pattern on a second sidewall of the second semiconductor structure;
selectively removing the first and second semiconductor patterns of the first and second semiconductor structures;
forming a first gate structure on top and bottom surfaces of the first channel patterns of the first semiconductor structure and extending in a second direction perpendicular to the first direction and parallel to the top surface of the substrate; and
forming a second gate structure on top and bottom surfaces of the second channel patterns of the second semiconductor structure and extending in the second direction.

2. The method according to claim 1, wherein the first and second channel patterns include silicon and the first and second semiconductor patterns include silicon germanium.

3. The method according to claim 1, wherein forming the first and second semiconductor structures includes:
stacking alternately and repeatedly first semiconductor layers and second semiconductor layers on a substrate;
etching a portion of the first semiconductor layers and a portion of the second semiconductor layers such that a first preliminary semiconductor structure and a second preliminary semiconductor structure are formed to have a step between the first and second preliminary semiconductor structures; and
patterning the first preliminary semiconductor structure and the second preliminary semiconductor structure to form the first semiconductor structure and the second semiconductor structure.

4. The method according to claim 3, wherein each of the second semiconductor layers has a substantially same thickness in a third direction perpendicular to a top surface of the substrate.

5. The method according to claim 3, wherein at least one of the second semiconductor layers has a different thickness in a third direction perpendicular to a top surface of the substrate from another of the second semiconductor layers.

6. The method according to claim 1, wherein the first epitaxial pattern, the second epitaxial pattern and the third epitaxial pattern are formed by performing a selective epitaxial growth process using the first and second semiconductor structures and the substrate as a seed.

7. The method according to claim 1, further comprising forming a first mold gate structure and a second mold gate structure that are respectively disposed on the first semiconductor structure and the second semiconductor structure and extend in the second direction, before forming the first through third epitaxial patterns.

8. The method according to claim 7, further comprising selectively removing the first and second mold gate structures to form a first opening and a second opening, before selectively removing the first and second semiconductor patterns,
wherein the first gate structure and the second gate structure are formed in the first opening and the second opening, respectively.

9. The method according to claim 7, further comprising forming a first spacer on sidewalls of a portion of the first mold gate structure that are positioned on an uppermost one of the first channel patterns and on sidewalls of a portion of the second mold gate structure that are positioned on an uppermost one of the second channel patterns.

10. The method according to claim 7, further comprising forming a second spacer on a sidewall of a portion of the first mold gate structure that is positioned between the first channel patterns of the first semiconductor structure and on a sidewall of a portion of the second mold gate structure that is positioned between the second channel patterns of the second semiconductor structure.

11. The method according to claim 1, further comprising:
forming a dummy semiconductor structure between the first semiconductor structure and the second semiconductor pattern and in which third semiconductor patterns and third channel patterns are alternately and repeatedly stacked on the substrate;
forming a fourth epitaxial pattern between the dummy semiconductor structure and the second semiconductor structure, the fourth epitaxial pattern and the second epitaxial pattern being spaced apart from each other by the dummy semiconductor structure;
selectively removing a portion of the third semiconductor patterns of the dummy semiconductor structure; and
forming a dummy gate electrode on top and bottom surfaces of the third channel patterns of the dummy semiconductor structure, wherein the dummy gate electrode extends in the second direction,
wherein the dummy gate electrode is formed between the first gate structure and the second gate structure and is not connected thereto.

* * * * *